(12) United States Patent
Santos Rodriguez et al.

(10) Patent No.: US 11,626,371 B2
(45) Date of Patent: Apr. 11, 2023

(54) SEMICONDUCTOR STRUCTURE WITH ONE OR MORE SUPPORT STRUCTURES

(71) Applicant: Infineon Technologies AG, Neubiberg (DE)

(72) Inventors: Francisco Javier Santos Rodriguez, Villach (AT); Markus Harfmann, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 17/135,399

(22) Filed: Dec. 28, 2020

(65) Prior Publication Data

US 2022/0208691 A1    Jun. 30, 2022

(51) Int. Cl.
*H01L 23/00* (2006.01)

(52) U.S. Cl.
CPC ................ *H01L 23/562* (2013.01)

(58) Field of Classification Search
None
See application file for complete search history.

(56) References Cited

U.S. PATENT DOCUMENTS

| | | | |
|---|---|---|---|
| 8,084,335 B2 | 12/2011 | Seddon et al. | |
| 8,292,690 B2 | 10/2012 | Seddon | |
| 8,361,903 B2 | 1/2013 | Feng et al. | |
| 2009/0020854 A1 | 1/2009 | Feng et al. | |
| 2012/0258554 A1* | 10/2012 | Belle | H01L 21/76251 257/E31.13 |
| 2014/0335676 A1* | 11/2014 | Berger | H01L 29/20 438/455 |
| 2015/0235900 A1 | 8/2015 | Bieck et al. | |
| 2019/0244850 A1 | 8/2019 | Berger et al. | |
| 2019/0244853 A1 | 8/2019 | Berger et al. | |
| 2019/0363057 A1 | 11/2019 | Santos Rodriguez et al. | |

FOREIGN PATENT DOCUMENTS

| | | |
|---|---|---|
| JP | 2012-064735 A | 3/2012 |
| JP | 2012-146889 A | 8/2012 |

OTHER PUBLICATIONS

Florian Bieck, et al., "Carrierless Design for Handling and Processing of Ultrathin Wafers", 2010 Electronic Components and Technology Conference, pp. 316-322.
Kiyofumi Sakaguchi, et al., "Extremely High Selective Etching of Porous Si for Single Etch-Stop Bond-and-Etch-Back Silicon-on-Insulator", The Japan Society of Applied Physics, vol. 34, 1995, pp. 842-847.
Simon Armbruster, "Micromachining of Monocrystalline Silicon Membranes for Sensor Applications Using Porous Silicon", IMTEK, University of Freiburg, Dissertation 2005, pp. 96-100.
Volker Lehmann, "The Electrochemical Dissolution of Silicon", Electrochemistry of Silicon - Instrumentation, Science, Materials and Applications, 2002, pp. 51-75.

\* cited by examiner

*Primary Examiner* — Bo B Jang
(74) *Attorney, Agent, or Firm* — Cooper Legal Group LLC

(57) ABSTRACT

One or more semiconductor structures and/or methods for forming support structures for semiconductor structures are provided. A first porosification layer is formed over a semiconductor substrate. A first epitaxial layer is formed over the first porosification layer. A second porosification layer is formed from a first portion of the first epitaxial layer and a support structure is formed from a second portion of the first epitaxial layer.

19 Claims, 30 Drawing Sheets

SEMICONDUCTOR STRUCTURE WITH ONE OR MORE SUPPORT STRUCTURES

TECHNICAL FIELD

The present disclosure relates to the field of support structures for semiconductor wafers.

BACKGROUND

Different types of semiconductor wafers can have different thicknesses. For example, depending on a diameter, some semiconductor wafers may have thicknesses around 700 micrometers for silicon substrates and around 370 micrometers for silicon carbide substrates. With thin wafer technology, such as for insulated gate bipolar transistors (IGBTs) or field-effect transistors (e.g., MOSFETs), a thin semiconductor wafer may have a thickness around 200 microns or less for a silicon substrate and around 100 micron or less for a silicon carbide substrate.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, a method is provided. The method may include forming a first porosification layer over a semiconductor substrate. A first epitaxial layer may be formed over the first porosification layer. A second porosification layer may be formed from a first portion of the first epitaxial layer. A support structure may be formed from a second portion of the first epitaxial layer.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
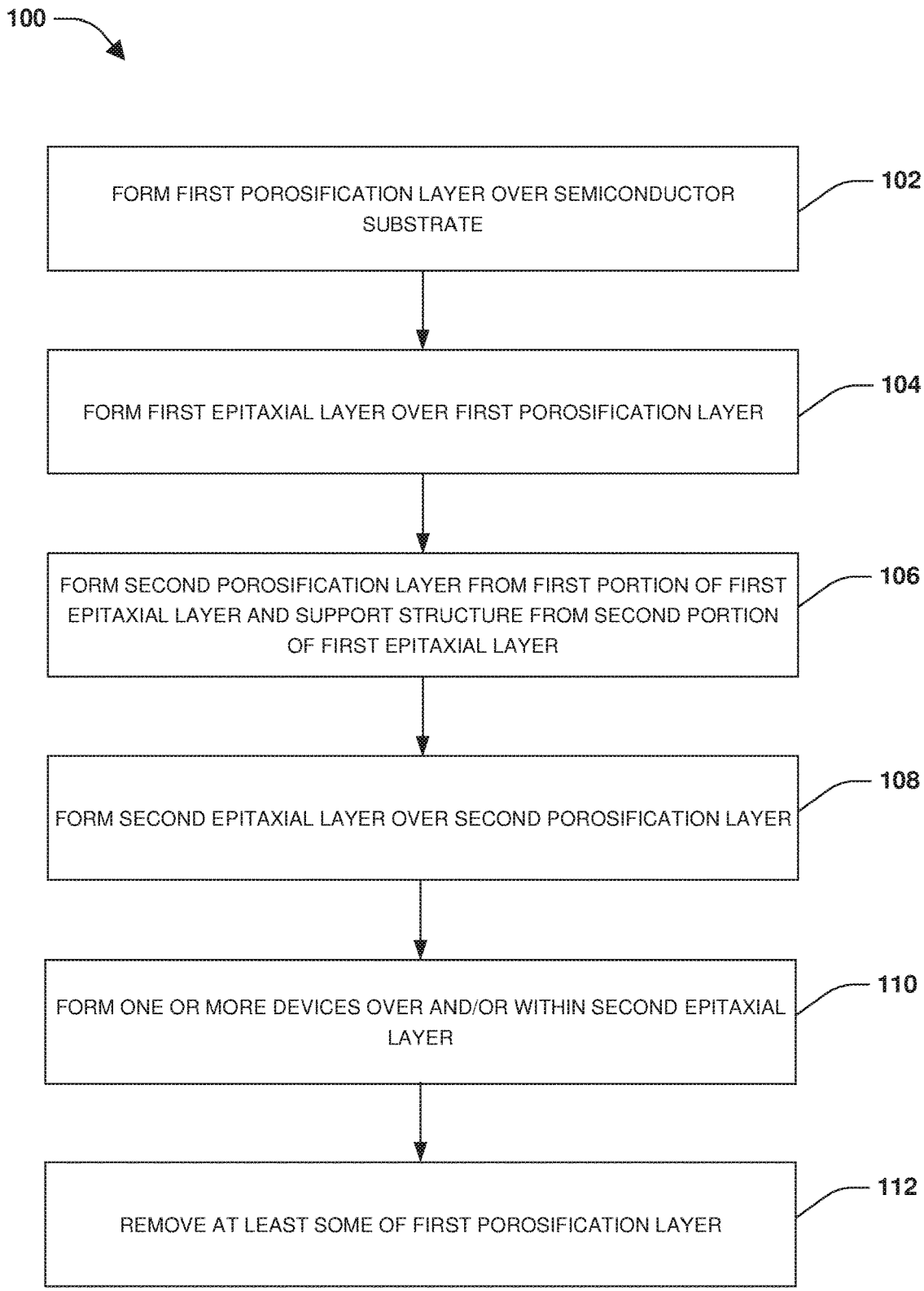
FIG. 1 is an illustration of an example method of forming one or more support structures for a semiconductor structure.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and device structures are shown in block diagram form in order to facilitate describing the claimed subject matter.

Semiconductor wafers, such as thin semiconductor wafers, can be susceptible to warpage and mechanical breakage due to the thinness of such semiconductor wafers. For example, mechanical load on certain areas of a semiconductor wafer, such as near an edge, can cause hairline cracks and/or can break the semiconductor wafer. This can be especially problematic for thin semiconductor wafers, such as where a semiconductor wafer has a thickness around 200 microns or less for a silicon substrate and around 100 microns or less for a silicon carbide substrate.

In order to strengthen a semiconductor wafer for reducing the likelihood of the semiconductor wafer being damaged during fabrication and/or handling, a support structure can be created for the semiconductor wafer, such as attached to or ground into the semiconductor wafer. For example, the support structure may be attached to a backside of the semiconductor wafer. This adds additional complexity to the fabrication process of the semiconductor wafer. Furthermore, a substrate of the semiconductor wafer cannot be reused, such as where the support structure is generated into the back of the semiconductor wafer by means of a mechanical, physical or chemical removal process (e.g. grinding, etching, electro discharge machining). Thus, the substrate cannot be reused due to the machining of substrate material during the for example grinding process. Other issues that can arise with adding the support structure to the semiconductor wafer relate to temperature restrictions and coefficient of thermal expansion mismatch.

Accordingly, as provided herein, one or more support structures are formed for a semiconductor structure, such as a thin semiconductor wafer, according to various shapes, sizes, and arrangements in order to strengthen the semiconductor structure to reduce the likelihood of warpage or breakage. In an embodiment, the semiconductor structure comprises a substrate. The substrate of the semiconductor structure may comprise a semiconductor wafer or may comprise the semiconductor wafer and also an epitaxial layer. The one or more support structures are formed by a porosification process applied to the substrate, such as to the epitaxial layer and/or a monocrystalline layer of the semiconductor structure. Because the support structures are not grounded into or attached to a backside of the semiconductor structure, a semiconductor substrate of the semiconductor structure can be reused. The support structures may be formed according to a process that does not introduce additional temperature restrictions and/or create coefficient of thermal expansion mismatch.

The support structures provide additional support/strength in order to help reduce the likelihood of mechanical breakage, warping, or other structural issues that could result from subsequent processing and/or handling of the semiconductor structure. These support structures can be particularly useful for thin semiconductor wafers that are otherwise susceptible to warping and mechanical breakage due to being so thin, such as a thin semiconductor wafer having a thickness around 200 microns or less for a silicon substrate and around 100 microns or less for a silicon carbide substrate.

Various shapes, sizes, arrangements, and/or or numbers of support structures are provided for a semiconductor structure. In one or more embodiments, any number of support structures may be formed for the semiconductor structure, such as a single support structure or multiple support structures. In one or more embodiments, the support structures may have various shapes, such as a loop-shaped structure (e.g., a ring structure), a pillar structure, a grid-shaped structure comprising a plurality of structures such as pillar structures, a loop-shaped structure disposed around one or more structures (e.g., around a single pillar structure or a grid-shaped structure of multiple pillar structures), a cylindrical shape, a rectangular shape, etc.

According to some embodiments a method is provided. The method includes forming a first porosification layer over a semiconductor substrate; forming a first epitaxial layer over the first porosification layer; and forming a second porosification layer from a first portion of the first epitaxial layer and a support structure from a second portion of the first epitaxial layer.

According to some embodiments, forming the first porosification layer includes applying a first porosification process to the semiconductor substrate and forming the second porosification layer includes applying a second porosification process to the first epitaxial layer. In general, a porosification process (e.g., at least one of the first porosification process or the second porosification process) may comprise an etching process, e.g. via electrochemical etching and/or via plasma etching.

According to some embodiments, the support structure includes a plurality of structures. At least some of the plurality of structures may, for example, be distanced to each other. Separately or in combination, at least some of the structures may adjoin each other.

According to some embodiments the support structure includes a loop-shaped structure (e.g., a ring-shaped structure).

According to some embodiments, the support structure includes a grid-shaped structure with one or more structures/bridges. For example, device structures may be aligned with the opening of the grid-shaped structure and kerf regions may be aligned with the structures/bridges of the grid-shaped structure.

According to some embodiments, the support structure includes a loop-shaped structure disposed around a second structure spaced apart from the loop-shaped structure. For example, the loop-shaped structure may be disposed around the device structures.

According to some embodiments, the second structure is a grid-shaped structure.

According to some embodiments, the method includes forming a second epitaxial layer over the second porosification layer. According to some embodiments, forming an epitaxial layer (e.g., the first epitaxial layer, the second epitaxial layer, etc.) over another component (e.g., the first porosification layer, the first epitaxial layer, etc.) may comprise a deposition process, for example an epitaxial deposition process, that deposits said epitaxial layer over said component. The second epitaxial layer may be formed directly on the second porosification layer or further epitaxial layers may be located between the second epitaxial layer and the second porosification layer.

According to some embodiments, the method includes forming one or more device structures over and/or within the second epitaxial layer.

According to some embodiments, the method includes separating an upper portion of the first porosification layer from a lower portion of the first porosification layer.

According to some embodiments an apparatus is provided. The apparatus includes a means for forming a first porosification layer over a semiconductor substrate; a means for forming a first epitaxial layer over the first porosification layer; and a means for forming a second porosification layer from a first portion of the first epitaxial layer and a support structure from a second portion of the first epitaxial layer.

According to some embodiments a method is provided. The method includes forming a support structure, the forming step including a porosification process; forming a device layer over the support structure; and forming one or more device structures over and/or within the device layer.

According to some embodiments, the method includes providing a porosification layer, the support structure formed over the porosification layer. In some embodiments, the support structure may directly adjoin the porosification layer. It may, however, also be possible that a further component is provided between the support structure and the porosification layer.

According to some embodiments, forming the support structure includes forming a first epitaxial layer, the porosification process being applied to the first epitaxial layer.

According to some embodiments, the porosification process porosifies only a portion of the first epitaxial layer, the support structure including a non-porosified portion of the first epitaxial layer.

According to some embodiments, the non-porosified portion includes a plurality of portions.

According to some embodiments, forming the device layer includes forming a second epitaxial layer.

According to some embodiments an apparatus is provided. The apparatus includes a means for forming a support structure using a porosification process; a means for forming a device layer over the support structure; and a means for forming one or more device structures over and/or within the device layer.

According to some embodiments a semiconductor structure is provided. The semiconductor structure includes a support structure including a first epitaxial material; a device layer disposed over the support structure, the device layer including a second epitaxial material; and one or more device structures over and/or within the device layer.

According to some embodiments, the support structure consists essentially of the first epitaxial material and the device layer consists essentially of the second epitaxial material.

According to some embodiments, the first epitaxial material and the second epitaxial material include a same material.

According to some embodiments, the support structure includes at least one of a plurality of portions, a loop-shaped structure, or a grid-shaped structure of structures/bridges.

According to some embodiments, the device structures are separated, for example by dicing through kerf region between neighboring device structures along a vertical direction. Dicing may comprise at least one of mechanical sawing, plasma dicing, laser-assisted dicing (e.g. stealth dicing, thermal laser separation). Dicing may be performed through the support structure, such as through the structures/bridges of the grid-shaped structure. In one or more embodiments, the dicing may be performed through a metal layer.

According to some embodiments a method is provided. The method includes performing a first porosification process upon a substrate to create a first porosification layer over the substrate; forming a first epitaxial layer (also called "epi layer" in the following) over the first porosification layer; and performing a second porosification process upon the first epi layer to form a second porosification layer from a first portion of the first epi layer and a support structure comprising a second portion the first epi layer.

According to some embodiments, the method includes forming a second epi layer over the second porosification layer.

According to some embodiments, the method includes forming one or more device structures on the second epi layer. The device structures may be formed above and/or on and/or in and/or from the second epi layer.

According to some embodiments, the method includes attaching a reversible carrier to the second epi layer.

According to some embodiments, the method includes performing backside processing while the reversible carrier is attached to the second epi layer.

According to some embodiments, the method includes removing the reversible carrier in response to completing all backside processing steps of the backside processing or after completing at least some backside processing steps of the backside processing (e.g., additional backside processing steps may be performed after the reversible carrier is removed).

According to some embodiments, the method includes removing the substrate, the first porosification layer, and the second porosification layer.

According to some embodiments, the method includes removing at least parts of or the entirety of at least one of the first porosification layer or the second porosification layer utilizing an etching process.

According to some embodiments, the method includes removing at least parts of or the entirety of at least one of the first porosification layer or the second porosification layer utilizing a mechanical process.

According to some embodiments, the method includes removing at least parts of or the entirety of at least one of the first porosification layer or the second porosification layer utilizing fluid.

According to some embodiments, the support structure comprises a ring structure.

According to some embodiments, the support structure is formed along a perimeter edge of a backside of the second epi layer, wherein the support structure has one of a circular shape, a square shape, or a rectangular shape.

According to some embodiments a method is provided. The method includes performing a first porosification process upon a substrate to create a first porosification layer over the substrate; forming a first epi layer over the first porosification layer; and performing a second porosification process upon the first epi layer to form a second porosification layer from a first portion of the first epi layer, a first support structure from a second portion of the first epi layer, and a second support structure from a third portion of the first epi layer.

According to some embodiments, the method includes forming a second epi layer over the second porosification layer; and forming one or more device structures over the second epi layer.

According to some embodiments, the method includes removing the substrate, the first porosification layer, and the second porosification layer to form a cavity between the first support structure and the second support structure.

According to some embodiments, the method includes filling the cavity with metal to form one of a continuous metal layer or a non-continuous metal layer within the cavity.

According to some embodiments a method is provided. The method includes performing a first porosification process upon a substrate to create a first porosification layer over the substrate; forming a first epi layer over the first porosification layer; and performing a second porosification process upon the first epi layer to form a second porosification layer from a first portion of the first epi layer, a support structure from a second portion of the first epi layer, and a grid support structure comprising a plurality of support structures formed from portions of the first epi layer.

According to some embodiments, the method includes forming a second epi layer over the second porosification layer; and forming one or more device structures over the second epi layer.

According to some embodiments, the method includes removing the substrate, the first porosification layer, and the second porosification layer to form cavities between the first support structure and the plurality of support structures of the grid support structure.

According to some embodiments, the method includes filling the cavities with metal to form one of a continuous metal layer or a non-continuous metal layer within the cavities.

Figure 2A:
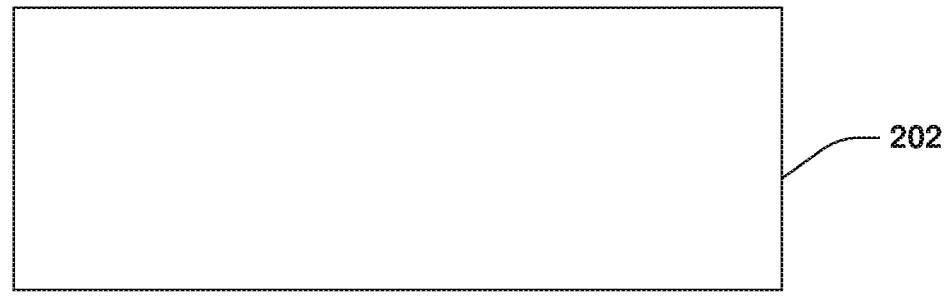
FIG. 2A is an illustration of a semiconductor substrate.
Figure 2B:
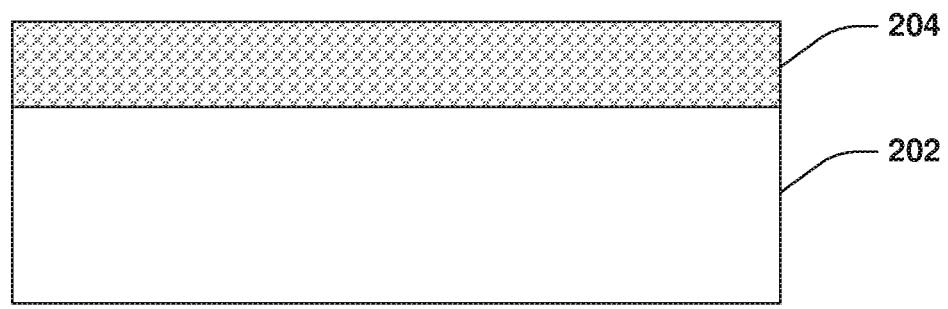
FIG. 2B is an illustration of a first porosification layer formed over a semiconductor substrate.

According to one or more embodiments an exemplary method 100 of forming one or more support structures for a semiconductor structure is illustrated by FIG. 1 and further described in conjunction with FIGS. 2A-2I, 3A 3I, and 4A-4I. FIGS. 2A-2I illustrate the method 100 being implemented to form a semiconductor structure 200. The semiconductor structure 200 comprises a semiconductor substrate 202, as illustrated by FIG. 2A. The semiconductor substrate 202 may comprise, for example, silicon, silicon carbide, gallium nitride, gallium arsenide, gallium oxide, indium phosphide, or any other substrate material that can be subject to a porosification process. At 102 of the method 100, a first porosification layer 204 is formed over the semiconductor substrate 202, as illustrated by FIG. 2B. In one or more embodiments, the first porosification layer 204 is formed by applying a first porosification process to the semiconductor substrate 202, such as a rimless or borderless porosification process, and thus a top portion of the semiconductor substrate 202 is transformed into the first porosification layer 204.

Figure 2C:
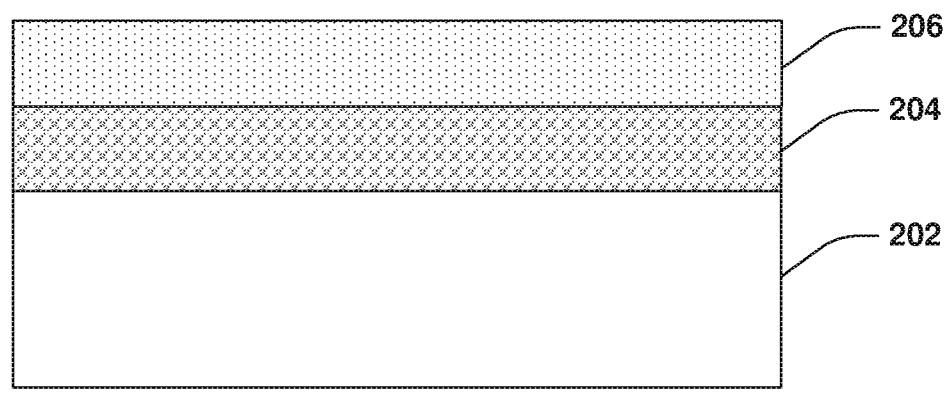
FIG. 2C is an illustration of a first epitaxial layer formed over a first porosification layer.
Figure 2D:
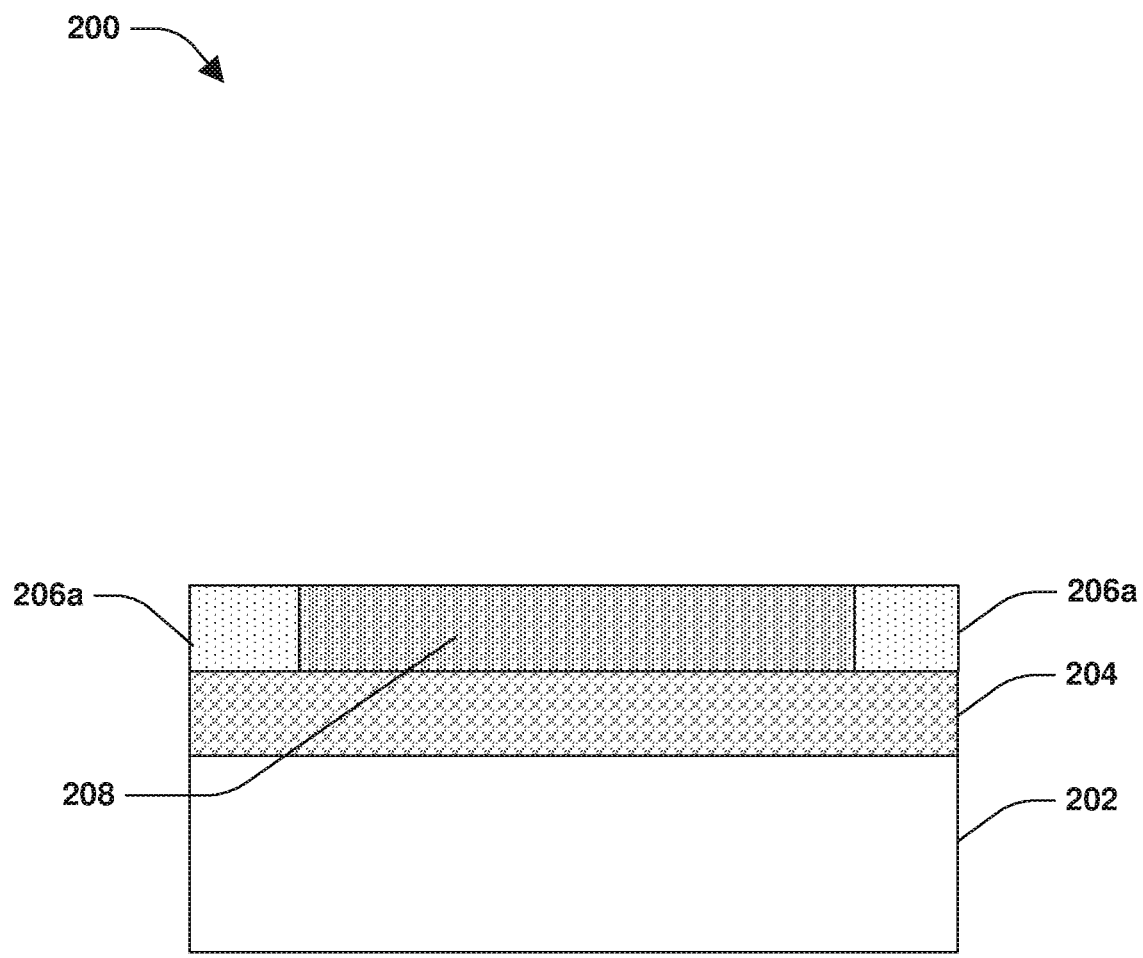
FIG. 2D is an illustration of a second porosification layer formed from a first portion of a first epitaxial layer and a support structure formed from a second portion of the first epitaxial layer.

At 104 of the method 100, a first epitaxial layer 206 is formed over the first porosification layer 204, as illustrated by FIG. 2C. In one or more embodiments, the first epitaxial layer 206 is formed by a deposition process that deposits the first epitaxial layer 206 over the first porosification layer 204. At 106 of the method 100, a second porosification layer 208 is formed from a first portion of the first epitaxial layer 206, as illustrated by FIG. 2D. In one or more embodiments, the second porosification layer 208 is formed by applying a second porosification process to the first portion of the first epitaxial layer 206. Portions of the first epitaxial layer 206 that are not porosified (non-porosified portions) remain as one or more support structures. In one or more embodiments, a support structure 206a is formed from a second portion of the first epitaxial layer 206 that is not porosified by the second porosification process, and thus the support structure 206a comprises a non-porosified portion of the first epitaxial layer 206. The support structure 206a is formed over the first porosification layer 204. In one or more embodiments, the support structure 206a includes a loop-shaped structure (e.g., a ring structure), which will be further described and illustrated in conjunction with FIG. 2I. It may be appreciated that any number, shape, size, and/or arrangement of support structures may be formed, and that at least some of these examples will be further described and illustrated in conjunction with FIGS. 3A-3I and FIGS. 4A-4I.

Figure 2E:
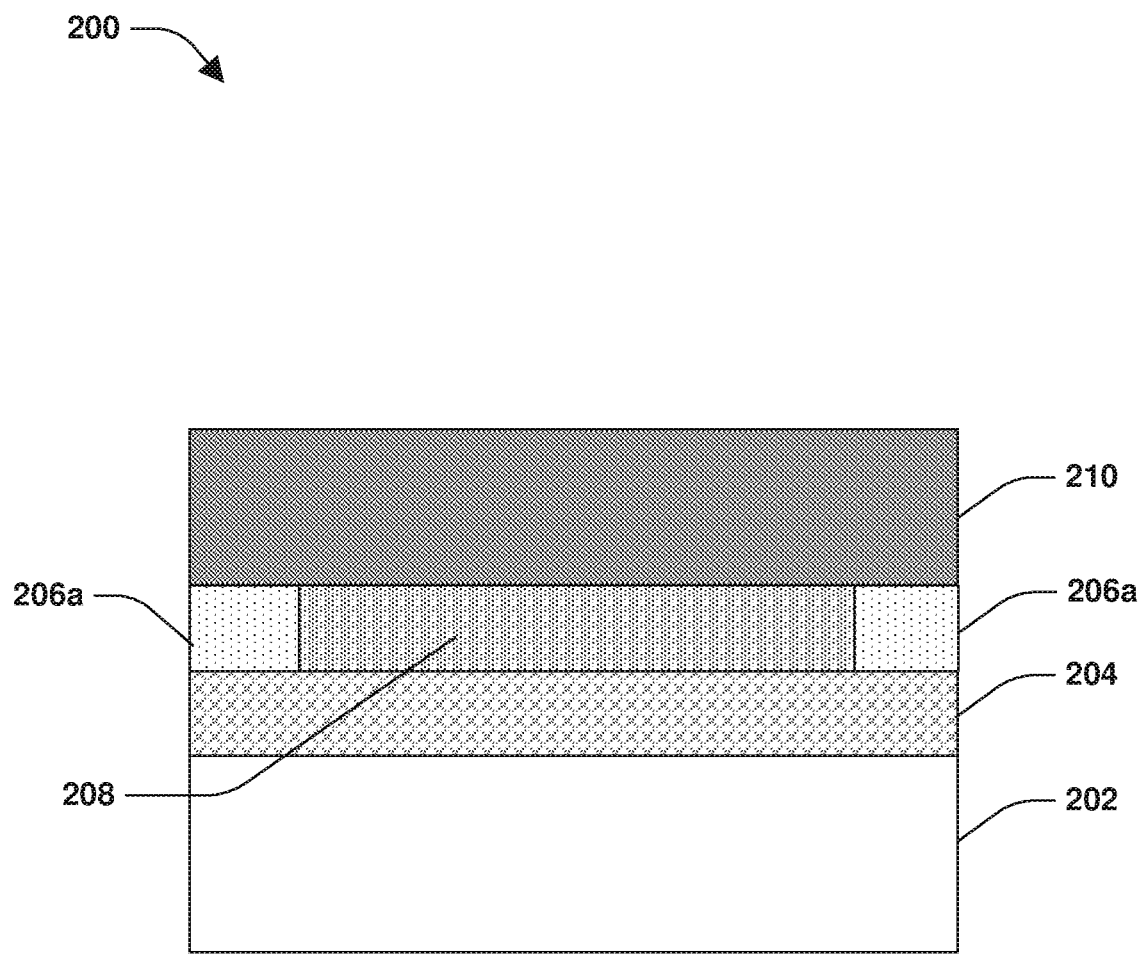
FIG. 2E is an illustration of a device layer formed over a support structure.

At 108 of the method 100, a second epitaxial layer 210 is formed over the second porosification layer 208, as illustrated by FIG. 2E. In one or more embodiments, the second epitaxial layer 210 is formed over the support structure 206a. The second epitaxial layer 210 may be formed by a deposition process that deposits the second epitaxial layer 210 over the second porosification layer 208 and/or the support structure 206a. In one or more embodiments, the second epitaxial layer 210 is a device layer comprising epitaxial material, which may be the same as or different than epitaxial material of the first epitaxial layer 206 (e.g., epitaxial material of the support structure 206a). In this way, the support structure 206a may consist essentially of the epitaxial material of the first epitaxial layer 206 and the device layer may consist essentially of the epitaxial material of the second epitaxial layer 210. In some embodiments, the second epitaxial layer 210 is a final epitaxial layer of the semiconductor structure 200. In some embodiments, one or more additional epitaxial layers are formed in addition to the first epitaxial layer 206 and the second epitaxial layer 210, such as in-between the first epitaxial layer 206 and the second epitaxial layer 210. It may be appreciated that any number of epitaxial layers may be formed.

Figure 2F:
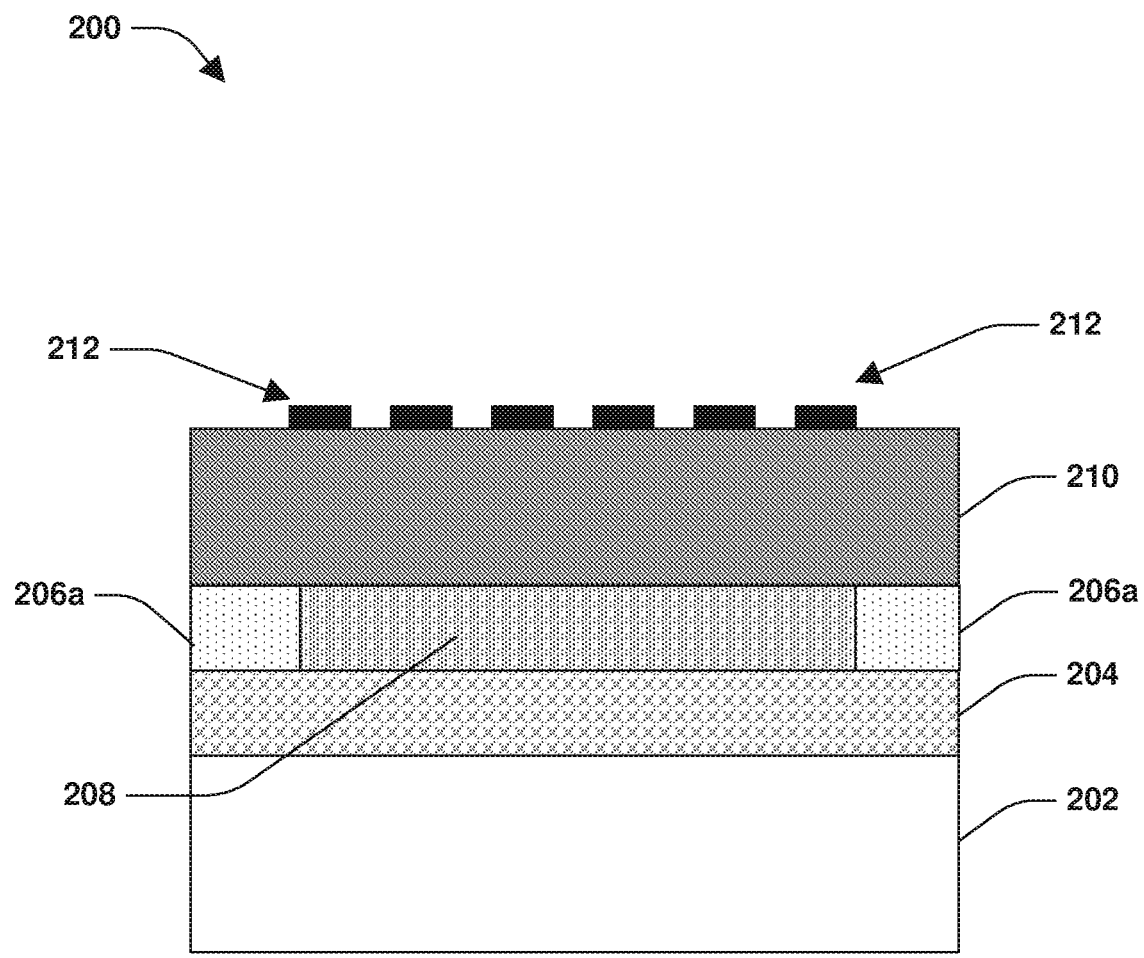
FIG. 2F is an illustration of one or more device structures formed over and/or within a device layer.
Figure 2G:
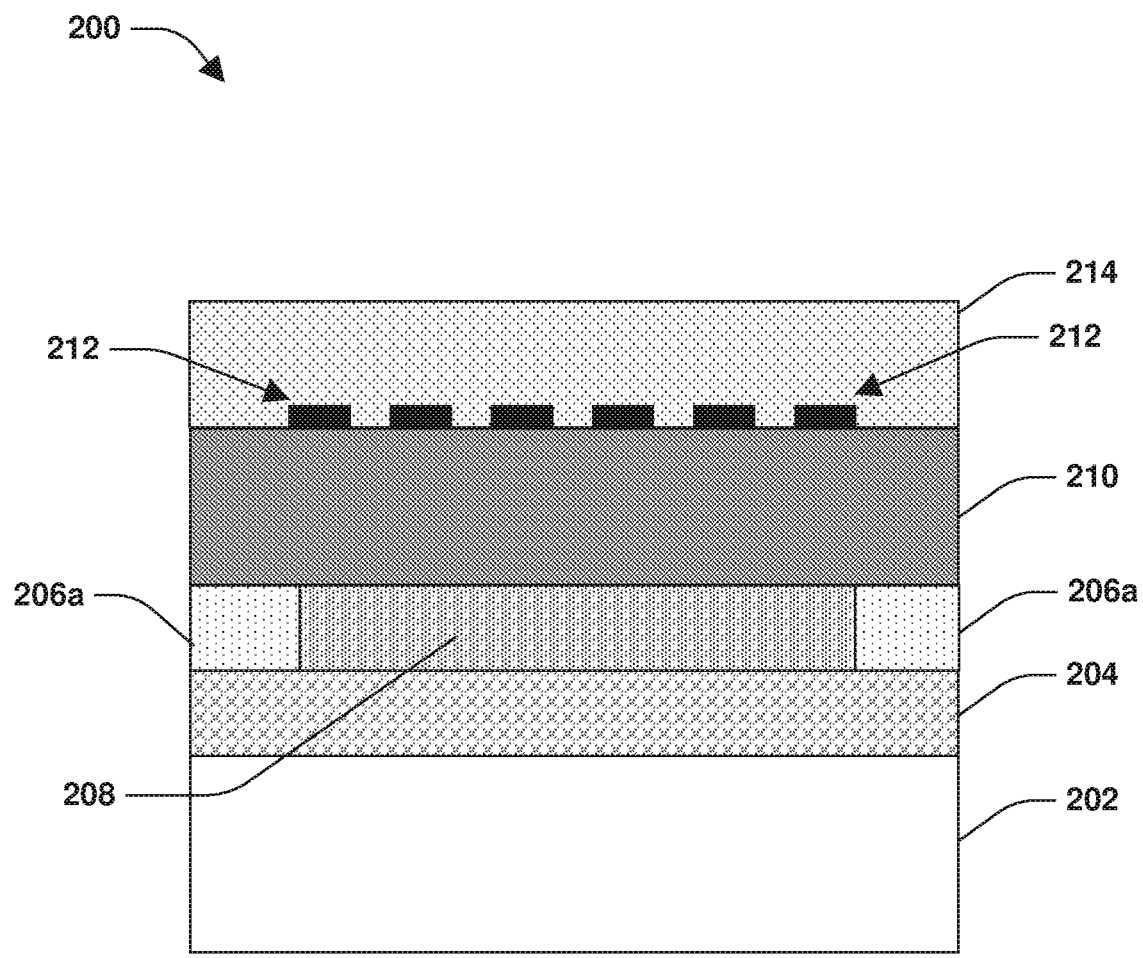
FIG. 2G is an illustration of a carrier attached to a semiconductor structure.

At 110 of the method 100, one or more device structures 212 are formed over and/or within the second epitaxial layer 210, such as over and/or within the device layer, as illustrated by FIG. 2F. In one or more embodiments, various device generation process steps may be performed at a front side of the semiconductor structure 200 to form the one or more device structures 212. Once the one or more device structures 212 are formed, a carrier 214 may be applied to the front side of the semiconductor structure 200, as illustrated by FIG. 2G. In one or more embodiments, the carrier 214 is a reverse carrier attachable to the front side of the semiconductor structure 200. The carrier 214 provides support for the front side of the semiconductor structure 200, such as while one or more subsequent processing steps are performed, such as backside processing. The carrier 214 may be attached to the front side such that the carrier 214 can be removed in a subsequent process step without destroying the semiconductor structure 200. In one or more embodiments, the semiconductor substrate 202 is removed/detached from the semiconductor structure 200, as illustrated by FIG. 2H, for example with the carrier 214 being attached to the front side.

Figure 2H:
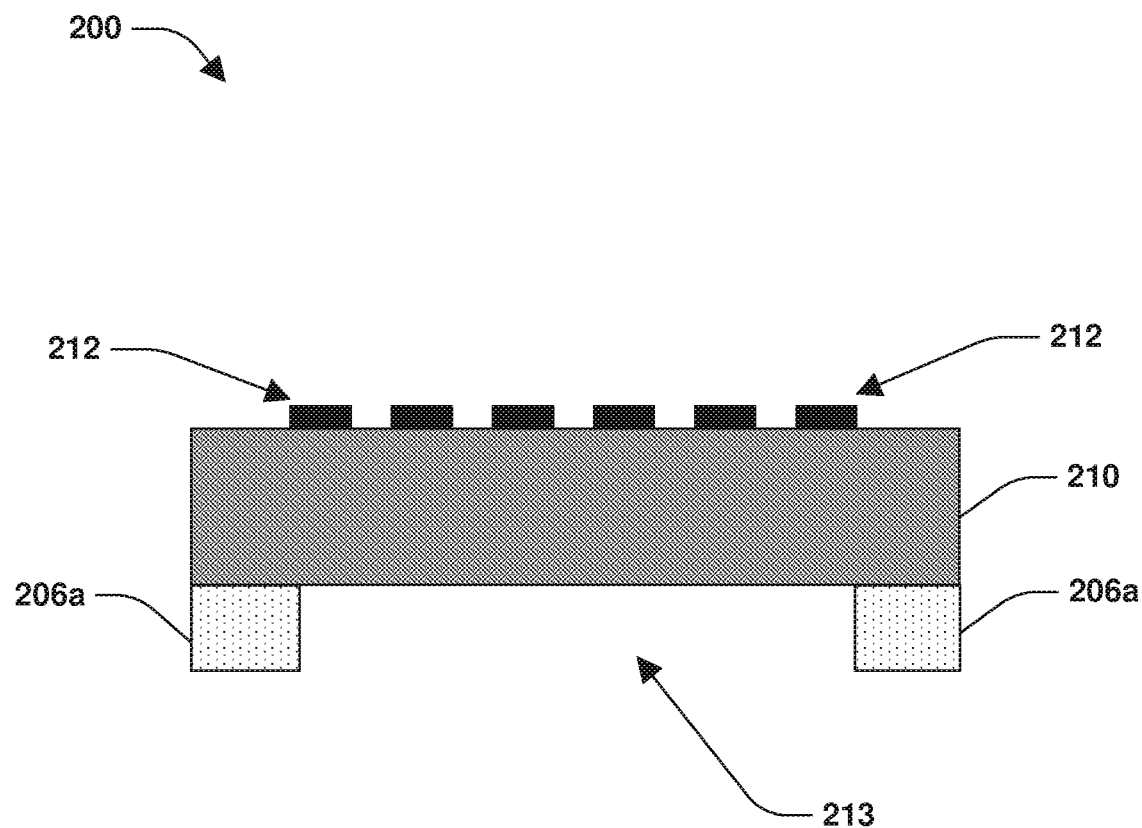
FIG. 2H is an illustration of a semiconductor structure with a support structure.

At 112 of the method 100, at least some of the first porosification layer 204 is removed from the semiconductor structure 200, as illustrated by FIG. 2H. In one or more embodiments, an upper portion of the first porosification layer 204 is separated from a lower portion of the first porosification layer 204. In one or more embodiments, at least some of the second porosification layer 208 is removed from the semiconductor structure 200. In one or more embodiments, a selective etching process can be utilized to selectively remove at least some of the first porosification layer 204 and/or at least some of the second porosification layer 208. In one or more embodiments, the selective etching process utilizes an etching material, such as an etching chemistry. The etching chemistry can be chosen such that it etches the porosification layer with a high selectivity compared to the material of semiconductor substrate (e.g., for silicon, hydrogen fluoride (HF), hydrogen peroxide (H2O2)) or such that the selectivity of the etching chemistry is lower (e.g., for nitric acid (HNO3), acetic acid (CH3COOH), potassium hydroxide (KOH), tetramethylammonium hydroxide (TMAH), as etching chemistry) but the selective etching process is controlled via regulators and/or moderators (e.g., peroxide, acetic acid) and/or surfactants. Removing at least some of the first porosification layer 204 and/or at least some of the second porosification layer 208 exposes the support structure 206a. For example, the support structure 206a may be a loop-shaped structure that loops along an edge of the semiconductor structure 200 (e.g., along an edge of the second epitaxial layer 210) to provide additional support and strength for the semiconductor structure 200. In particular, the loop-shaped structure may have the shape of a ring, such as a support ring.

While the carrier 214 is attached to the front side of the semiconductor structure 200, various backside processing steps may be performed, such as deposition, etching, conditioning, lithography, implantation, annealing, and/or other processing steps. Once the backside processing steps are complete, the carrier 214 may be removed from the semiconductor structure 200, as illustrated by FIG. 2H.

Figure 2I:
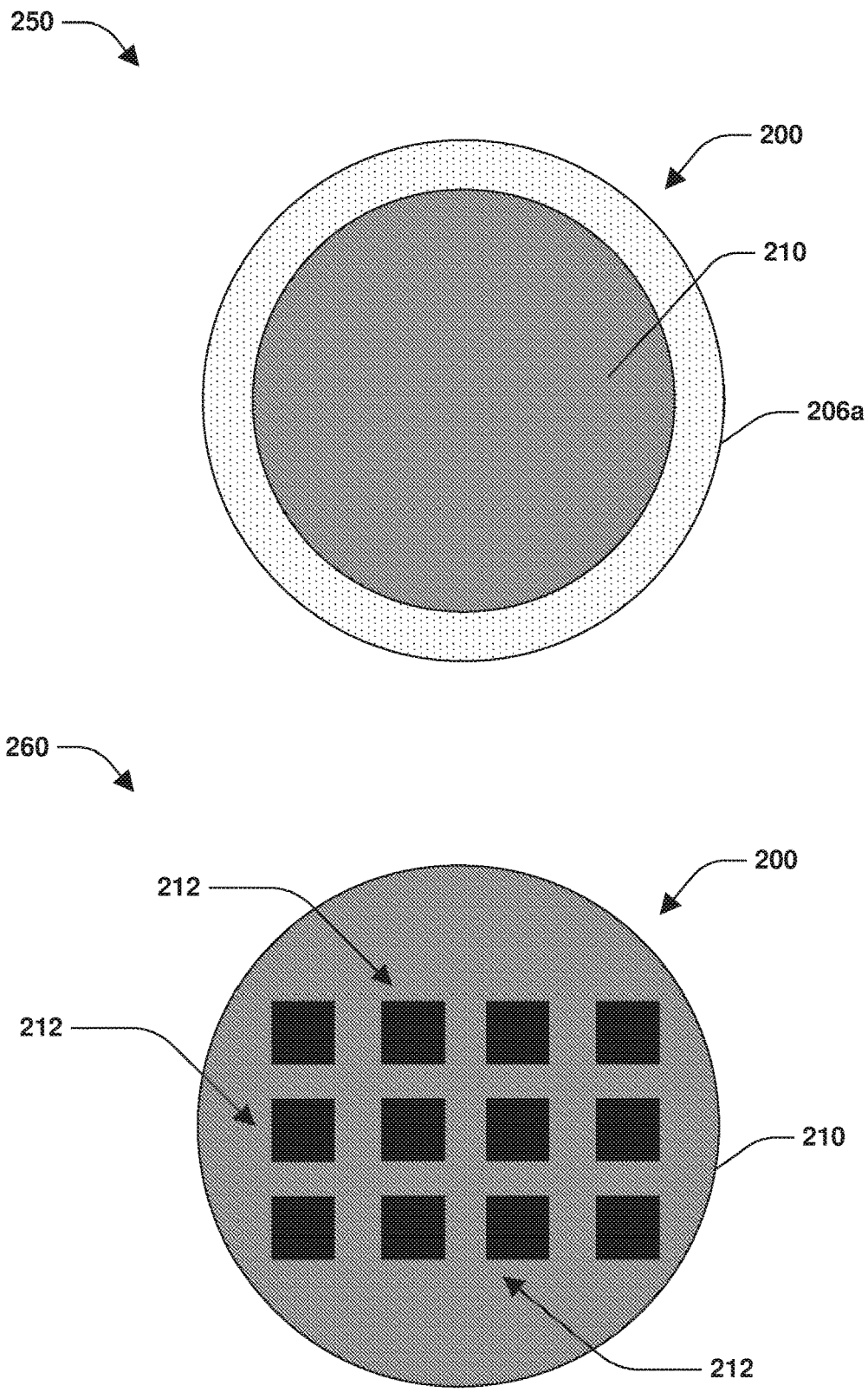
FIG. 2I is an illustration of an underneath view and a top down view of a semiconductor structure.

FIG. 2I illustrates an underneath view 250 of the semiconductor structure 200. In one or more embodiments, the support structure 206a has a ring shape that surrounds (e.g., circles around) an outer edge of the semiconductor structure 200, such as where the one or more device structures 212 are positioned over the second epitaxial layer 210 and over an inner cavity 213 of the support structure 206a, as illustrated by FIG. 2H. In this way, the support structure 206a may be positioned near or along an outer perimeter of the semiconductor structure 200. FIG. 2I illustrates a top down view 260 of the semiconductor structure 200. In one or more embodiments, the one or more device structures 212 are positioned over and/or within the second epitaxial layer 210 (device layer).

Figure 3A:
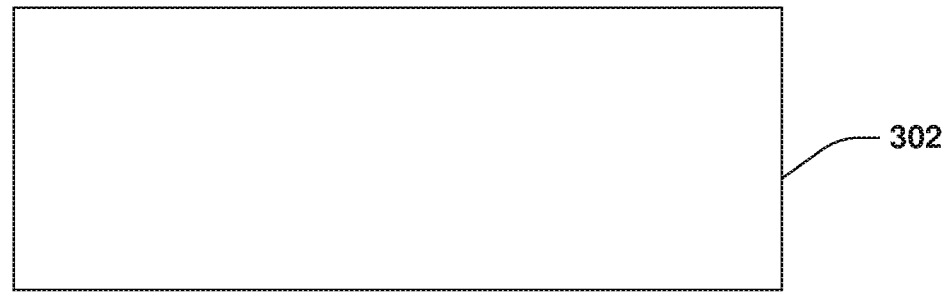
FIG. 3A is an illustration of a semiconductor substrate.
Figure 3B:
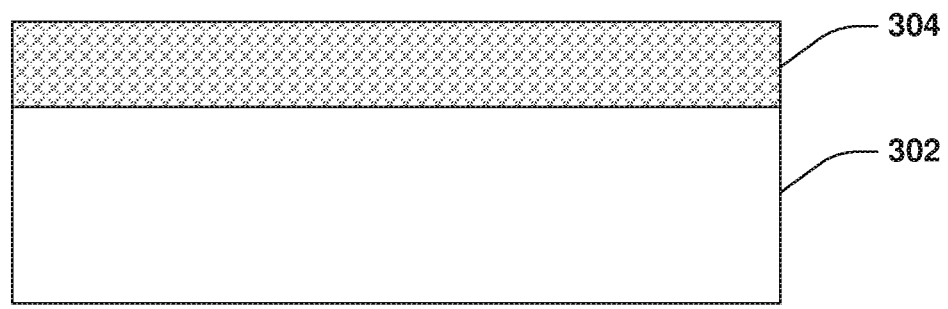
FIG. 3B is an illustration of a first porosification layer formed over a semiconductor substrate.
Figure 3C:
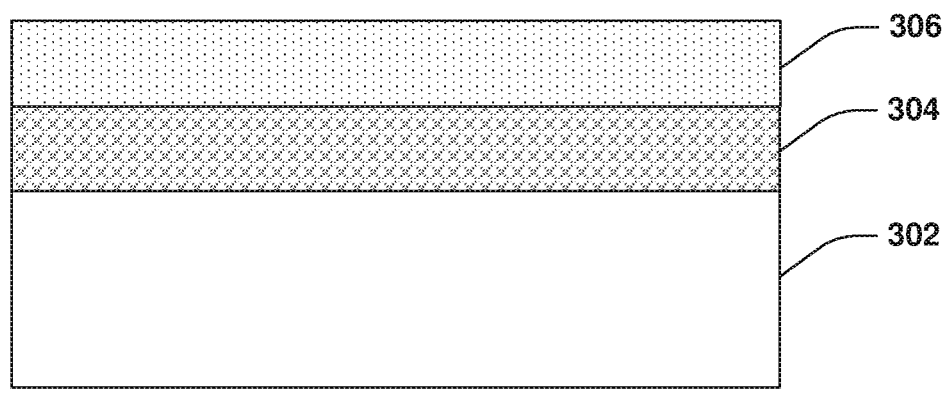
FIG. 3C is an illustration of a first epitaxial layer formed over a first porosification layer.

FIGS. 3A-3I illustrate the method 100 being implemented to form a semiconductor structure 300 comprising a first support structure 306a and a second support structure 306b. The semiconductor structure 300 comprises a semiconductor substrate 302, as illustrated by FIG. 3A. The semiconductor substrate 302 may comprise silicon, silicon carbide, or any other substrate material. At 102 of the method 100, a first porosification layer 304 is formed over the semiconductor substrate 302, as illustrated by FIG. 3B. In one or more embodiments, the first porosification layer 304 is formed by applying a first porosification process to the semiconductor substrate 302, and thus a top portion of the semiconductor substrate 302 is transformed into the first porosification layer 304. In this way, the first porosification layer 304 is formed on, over, or from the semiconductor substrate 302, such as where the first porosification layer 304 is formed as part of the semiconductor substrate 302 (e.g., a portion of the semiconductor substrate 302 is modified to form the first porosification layer 304). At 104 of the method 100, a first epitaxial layer 306 is formed over the first porosification layer 304, as illustrated by FIG. 3C. In one or more embodiments, the first epitaxial layer 306 is formed by a deposition process that deposits the first epitaxial layer 306 over the first porosification layer 304.

Figure 3D:
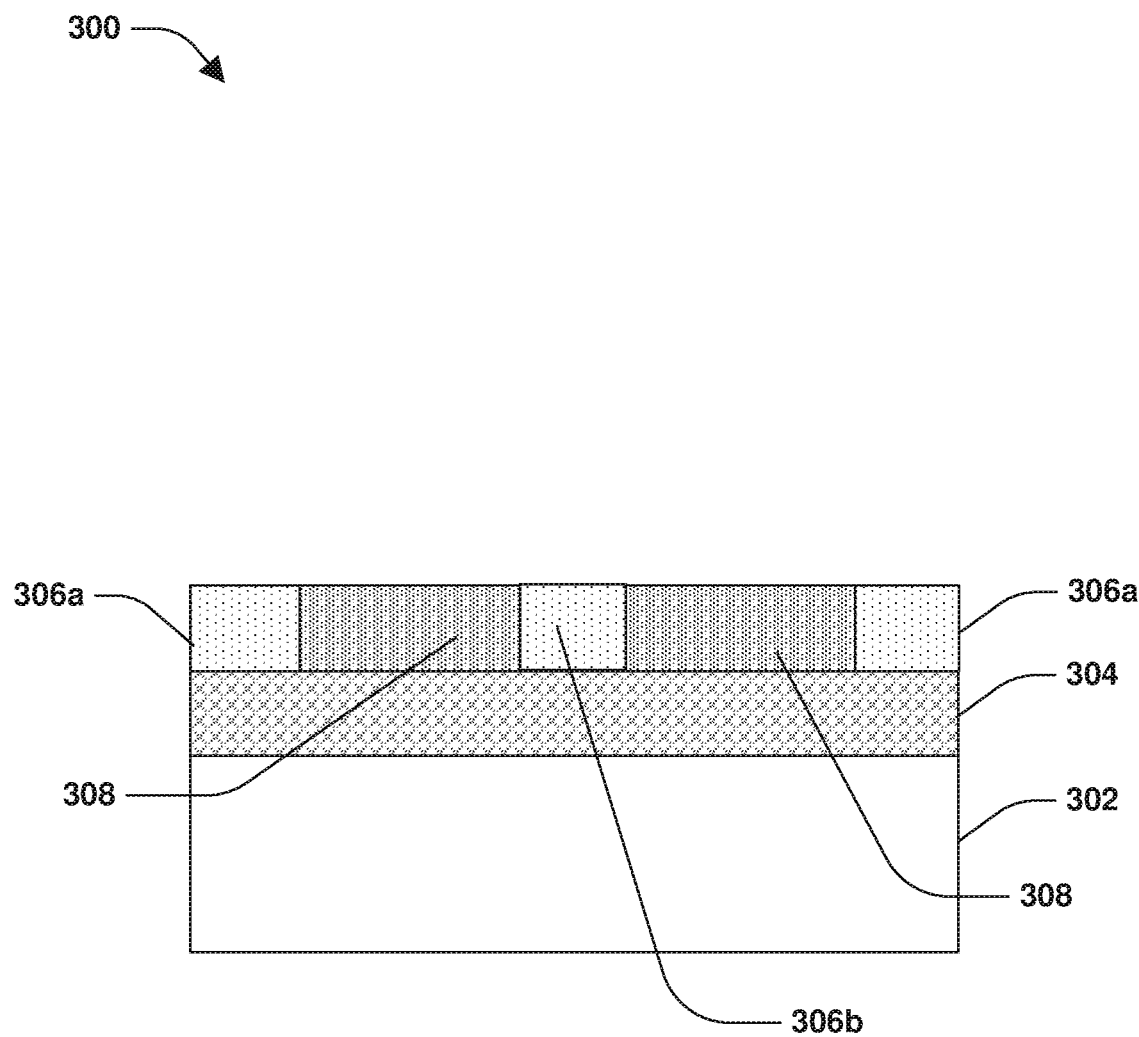
FIG. 3D is an illustration of a second porosification layer formed from a first portion of a first epitaxial layer, and a first support structure and a second support structure formed from a second and third portion of the first epitaxial layer.

At 106 of the method 100, a second porosification layer 308 is formed from a first portion of the first epitaxial layer 306, as illustrated by FIG. 3D. In one or more embodiments, the second porosification layer 308 is formed by applying a second porosification process to the first portion of the first epitaxial layer 306. In one or more embodiments, the second porosification process is performed with marginal exclusion. Portions of the first epitaxial layer 306 that are not porosified (non-porosified portions of the first epitaxial layer 306) remain as one or more support structures. The non-porosified portions are formed by utilizing a hard mask or seal ring to block the second porosification process from porosifying the non-porosified portions. In one or more embodiments, a first support structure 306a is formed from a second portion of the first epitaxial layer 306 that is not porosified by the second porosification process, and thus the first support structure 306a comprises a non-porosified portion of the first epitaxial layer 306. The first support structure 306a is formed over the first porosification layer 304. In one or more embodiments, the first support structure 306a includes a loop-shaped structure (e.g., a ring structure), which will be further described and illustrated in conjunction with FIG. 3I.

In one or more embodiments, a second support structure 306b is formed from a third portion of the first epitaxial layer 306 that is not porosified by the second porosification process, and thus the second support structure 306b comprises a non-porosified portion of the first epitaxial layer 306. The second support structure 306b is formed over the first porosification layer 304. In one or more embodiments, the second support structure 306b includes a structure, such as a column structure, around which the first support structure 306a (the loop-shaped structure) is disposed and spaced apart from by the second porosification layer 308, which will be further described and illustrated in conjunction with FIG. 3I. It may be appreciated that any number, shape, size, and/or arrangement of support structures may be formed. In one or more embodiments, both the first support structure 306a and the second support structure 306b are formed, as illustrated by FIG. 3D. In one or more embodiments, merely second support structure 306b, and not the first support structure 306a, may be formed.

Figure 3E:
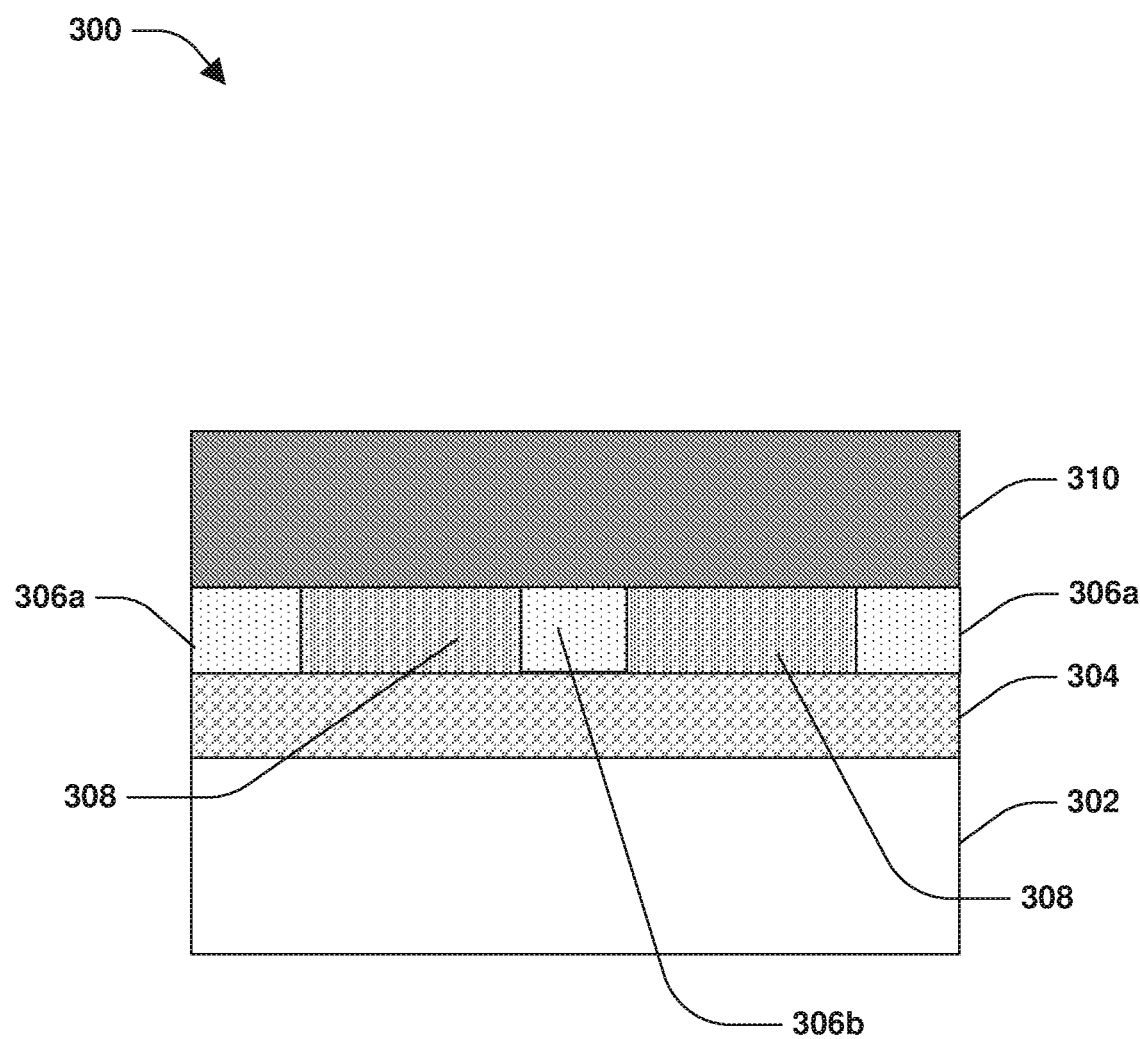
FIG. 3E is an illustration of a device layer formed over a support structure.

At 108 of the method 100, a second epitaxial layer 310 is formed over the second porosification layer 308, as illustrated by FIG. 3E. In one or more embodiments, the second epitaxial layer 310 is formed over the first support structure 306a and/or the second support structure 306b. The second epitaxial layer 310 may be formed by a deposition process that deposits the second epitaxial layer 310 over the second porosification layer 308, the first support structure 306a, and/or the second support structure 306b. In one or more embodiments, the second epitaxial layer 310 is a device layer comprising epitaxial material, which may be the same or different than epitaxial material of the first epitaxial layer 306 (e.g., epitaxial material of the first support structure 306a, and/or the second support structure 306b). In this way, the first support structure 306a and/or the second support structure 306b consist essentially of the epitaxial material of the first epitaxial layer 306 and the device layer consists essentially of the epitaxial material of the second epitaxial layer 310.

Figure 3F:
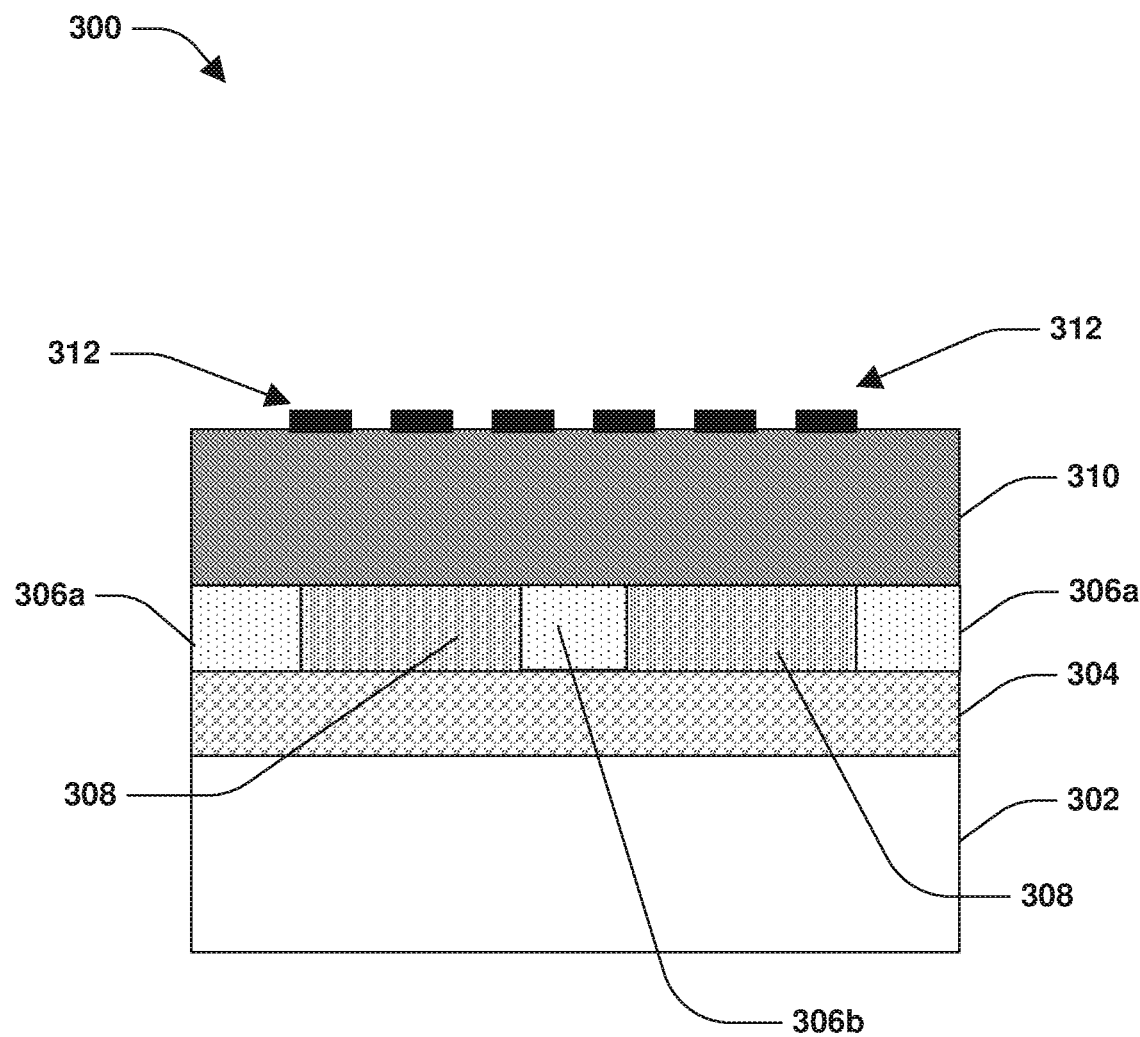
FIG. 3F is an illustration of one or more device structures formed over and/or within a device layer.
Figure 3G:
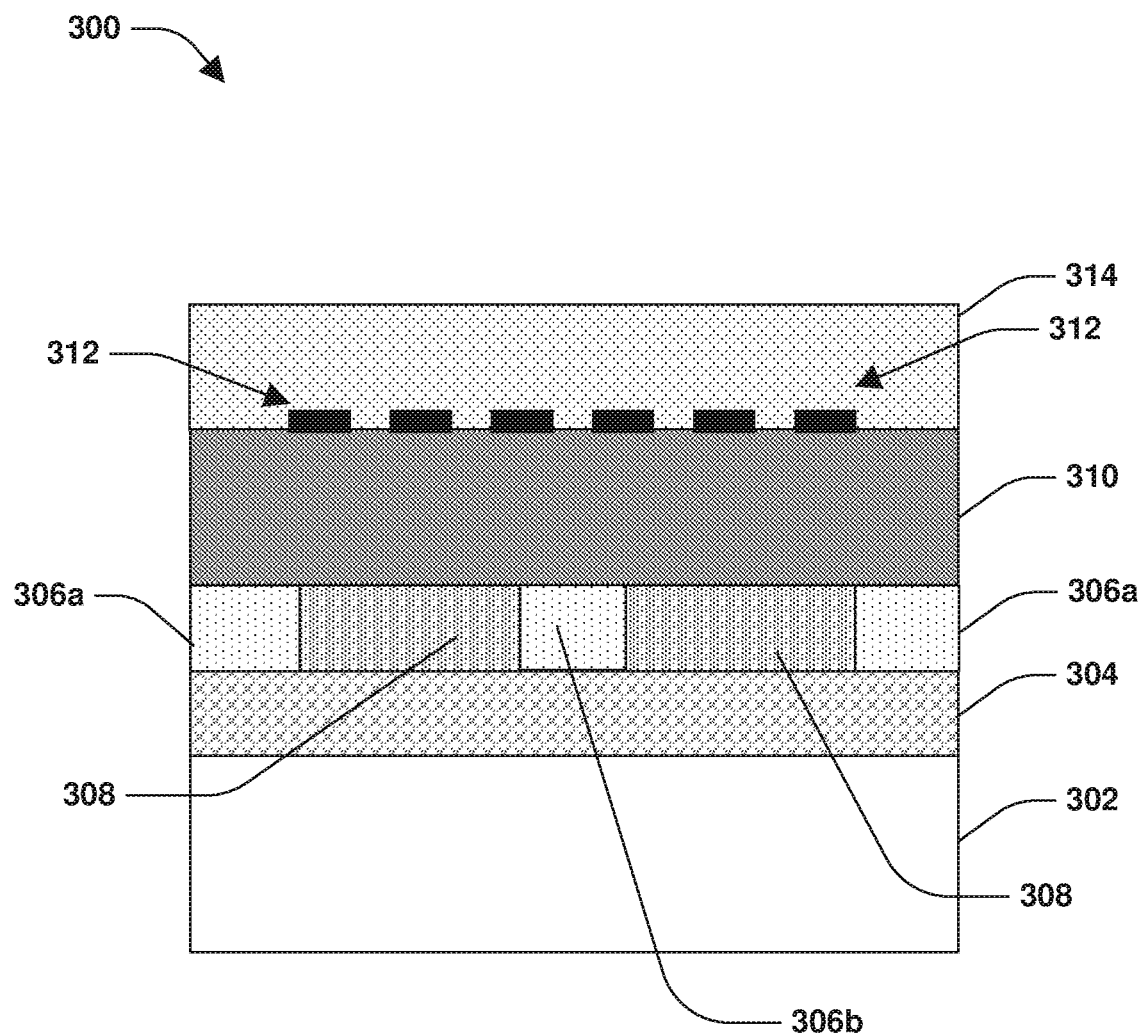
FIG. 3G is an illustration of a carrier attached to a semiconductor structure.

At 110 of the method 100, one or more device structures 312 are formed over and/or within the second epitaxial layer 310, such as over and/or within the device layer, as illustrated by FIG. 3F. In one or more embodiments, various device generation process steps may be performed on a front side of the semiconductor structure 300 to form the one or more device structures 312. Once the one or more device structures 312 are formed, a carrier 314 is applied to the front side of the semiconductor structure 300, as illustrated by FIG. 3G. In one or more embodiments, the carrier 314 is a reverse carrier attachable to the front side of the semiconductor structure 300. The carrier 314 provides support for the front side of the semiconductor structure 300, such as while one or more subsequent processing steps are performed. In one or more embodiments, the semiconductor substrate 302 is removed/detached from the semiconductor structure 300, as illustrated by FIG. 3H.

Figure 3H:
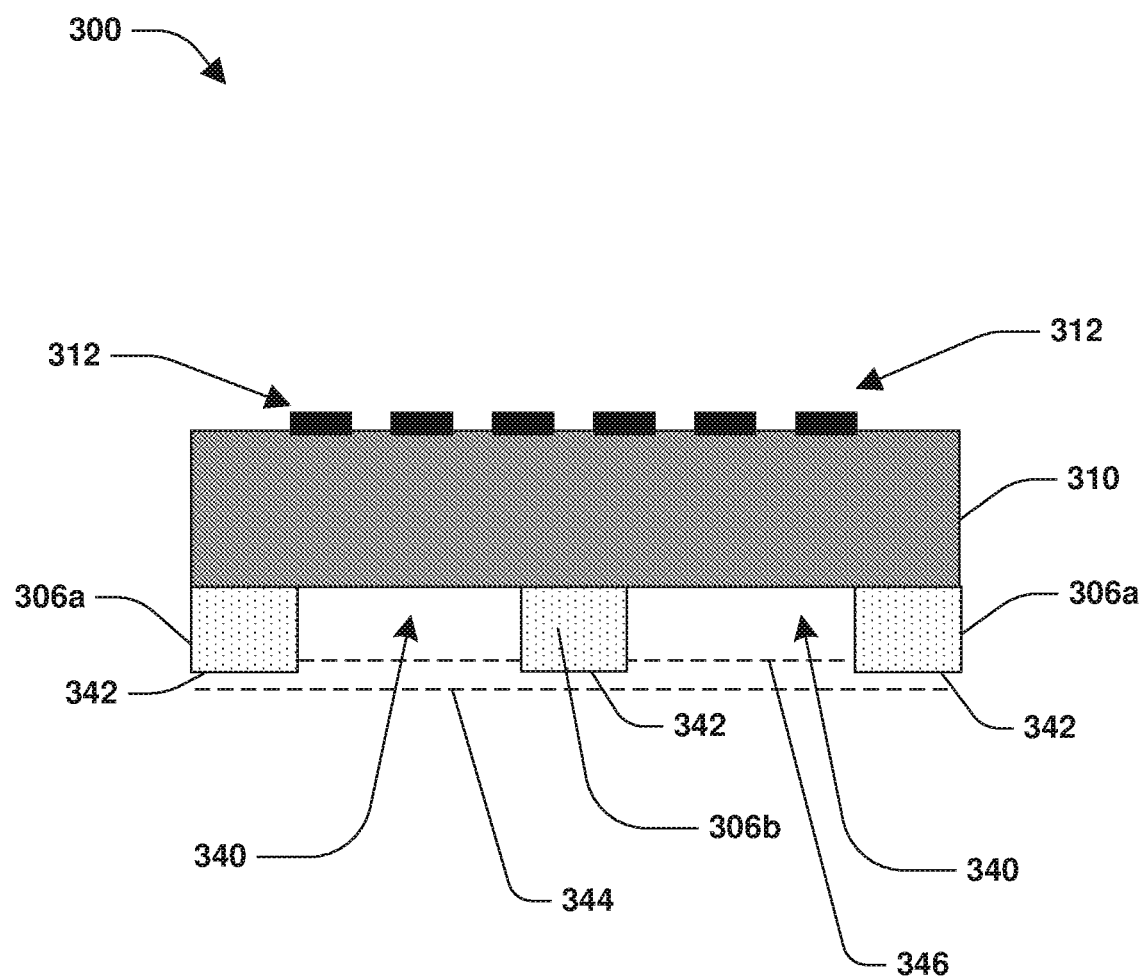
FIG. 3H is an illustration of a semiconductor structure with a support structure.

At 112 of the method 100, at least some of the first porosification layer 304 is removed from the semiconductor structure 300, as illustrated by FIG. 3H. In one or more embodiments, an upper portion of the first porosification layer 304 is separated from a lower portion of the first porosification layer 304. In one or more embodiments, at least some of the second porosification layer 308 is removed from the semiconductor structure 300. In one or more embodiments, a selective etching process can be utilized to selectively remove at least some of the first porosification layer 304 and/or at least some of the second porosification layer 308. In one or more embodiments, the selective etching process utilizes an etching material, such as an etching chemistry. The etching chemistry can be chosen such that it etches the porosification layer with a high selectivity compared to the material of semiconductor substrate (e.g., for silicon, hydrogen fluoride (HF), hydrogen peroxide (H2O2)) or such that the selectivity of the etching chemistry is lower (e.g., for nitric acid (HNO3), acetic acid (CH3COOH), potassium hydroxide (KOH), tetramethylammonium hydroxide (TMAH), as etching chemistry) but the selective etching process is controlled via regulators and/or moderators (e.g., peroxide, acetic acid) and/or surfactants. Removing at least some of the first porosification layer 304 and/or at least some of the second porosification layer 308 exposes the first support structure 306a, such as a loop-shaped structure that loops along an edge of the semiconductor structure 300, and the second support structure 306b, such as column structure, to provide additional support and strength for the semiconductor structure 300.

While the carrier 314 is attached to the front side of the semiconductor structure 300, various backside processing steps may be performed, such as lithography, implantation, annealing, and/or other processing steps. In one or more embodiments, backside metallization can be performed upon a backside of the semiconductor structure 300. In one or more embodiments, the backside metallization may fill cavities 340 between the first support structure 306a and the second support structure 306b. The resulting metal layer may be a continuous metal layer where metal is filled within the cavities 340 and over top surfaces 342 of the first support structure 306a and the second support structure 306b (e.g., the metal is filled up to dashed line 344) or a non-continuous metal layer where metal is filled within the cavities 340 but below the top surfaces 342 of the first support structure 306a and the second support structure 306b (e.g., the metal is filled up to dashed line 346). Once the backside processing steps are complete, the carrier 314 may be removed from the semiconductor structure 300, as illustrated by FIG. 3H.

Figure 3I:
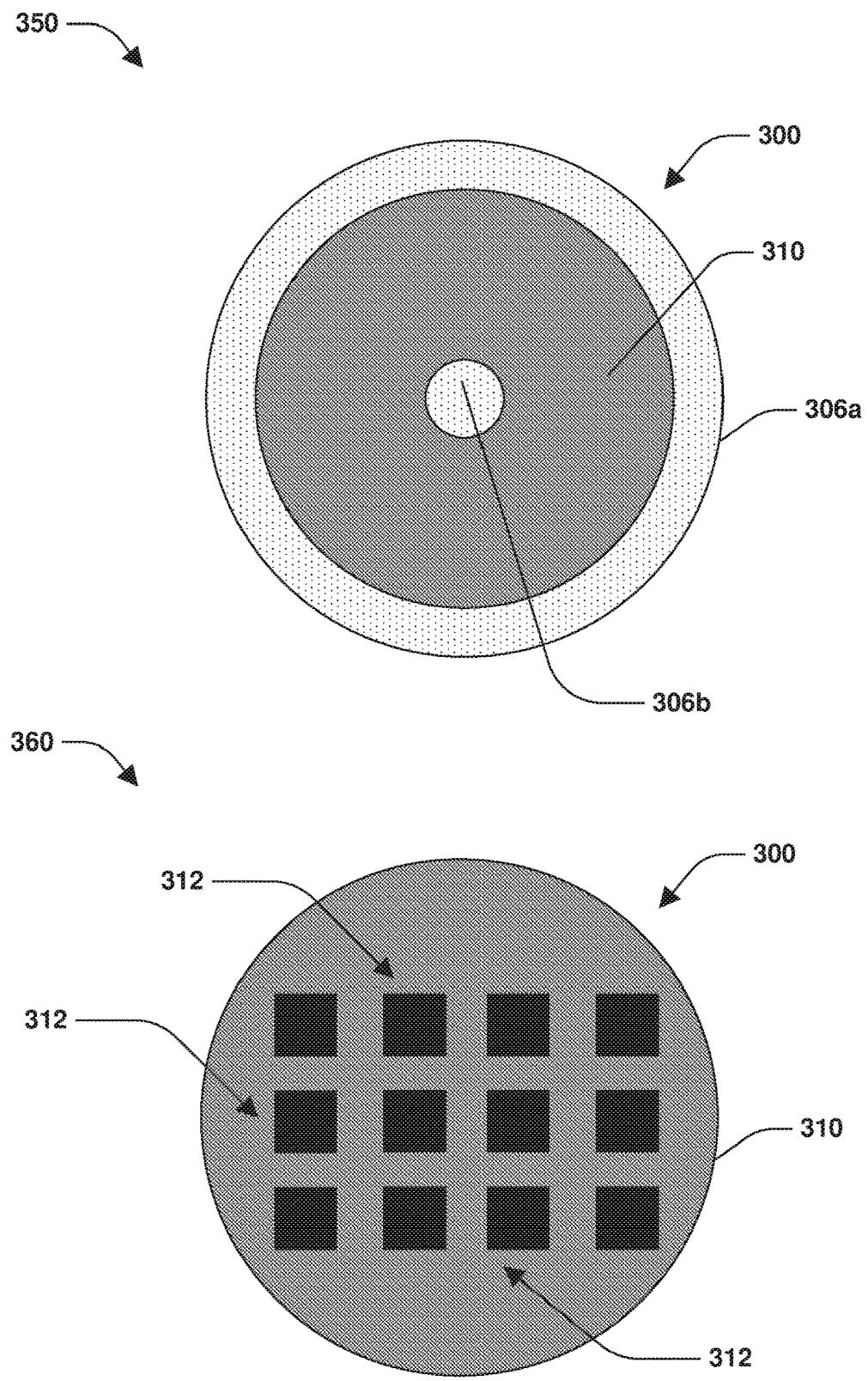
FIG. 3I is an illustration of an underneath view and a top down view of a semiconductor structure.

FIG. 3I illustrates an underneath view 350 of the semiconductor structure 300. In one or more embodiments, first support structure 306a is loop shaped, such that the first support structure 306a loops around an edge of the semiconductor structure 300, such as around an edge of the second epitaxial layer 310 (device layer). In one or more embodiments, the second support structure 306a has a column shape, and is spaced apart from the first support structure 306a by the second epitaxial layer 310 such that the first support structure 306a loops around the second support structure 306b. FIG. 3I illustrates a top down view 360 of the semiconductor structure 300. In one or more embodiments, the one or more device structures 312 are positioned over and/or within the second epitaxial layer 310 (device layer).

Figure 4A:
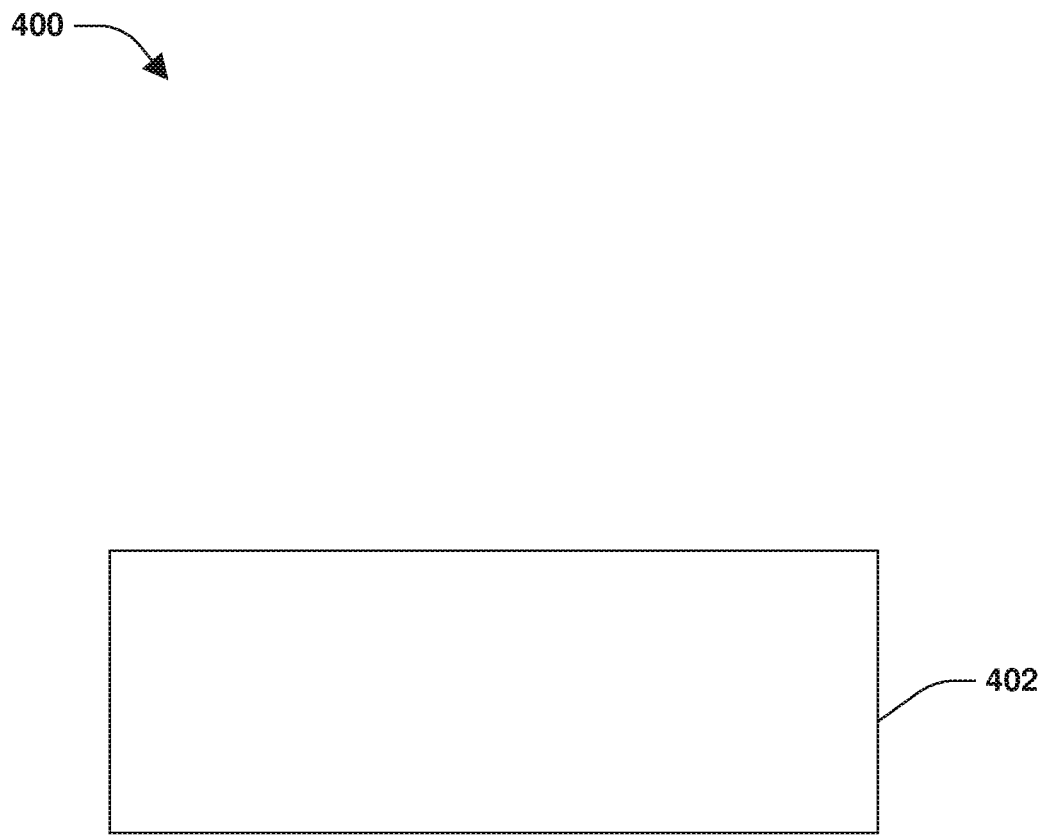
FIG. 4A is an illustration of a semiconductor substrate.
Figure 4B:
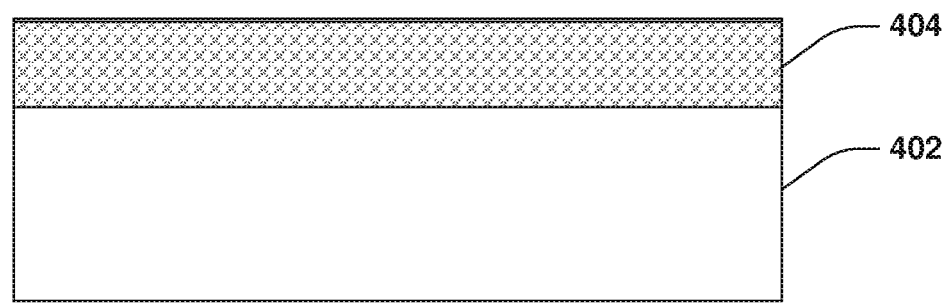
FIG. 4B is an illustration of a first porosification layer formed over a semiconductor substrate.
Figure 4C:
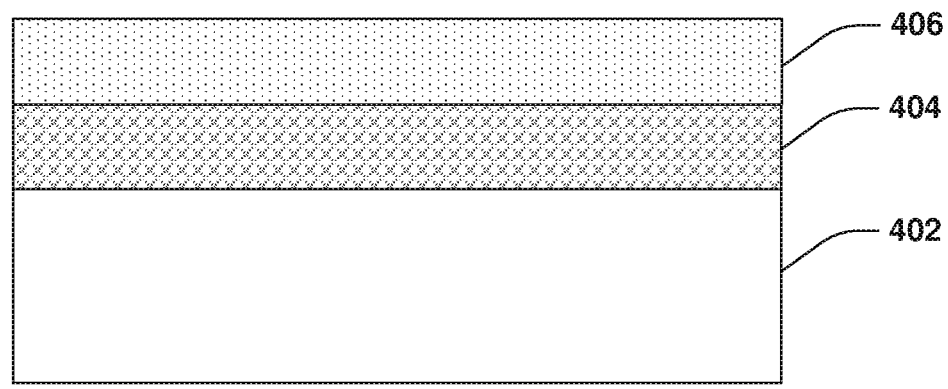
FIG. 4C is an illustration of a first epitaxial layer formed over a first porosification layer.

FIGS. 4A-4I illustrate the method 100 being implemented to form a semiconductor structure 400 comprising a first support structure 406a and a second support structure comprising a plurality of structures, such as a first structure 406b, a second structure 406c, a third structure 406d, a fourth structure 406e, and a fifth structure 406f. The semiconductor structure 400 comprises a semiconductor substrate 402, as illustrated by FIG. 4A. The semiconductor substrate 402 may comprise silicon, silicon carbide, or any other substrate material. At 102 of the method 100, a first porosification layer 404 is formed over the semiconductor substrate 402, as illustrated by FIG. 4B. In one or more embodiments, the first porosification layer 404 is formed by applying a first porosification process to the semiconductor substrate 402, and thus a top portion of the semiconductor substrate 402 is transformed into the first porosification layer 404. At 104 of the method 100, a first epitaxial layer 406 is formed over the first porosification layer 404, as illustrated by FIG. 4C. In one or more embodiments, the first epitaxial layer 406 is formed by a deposition process that deposits the first epitaxial layer 406 over the first porosification layer 404.

Figure 4D:
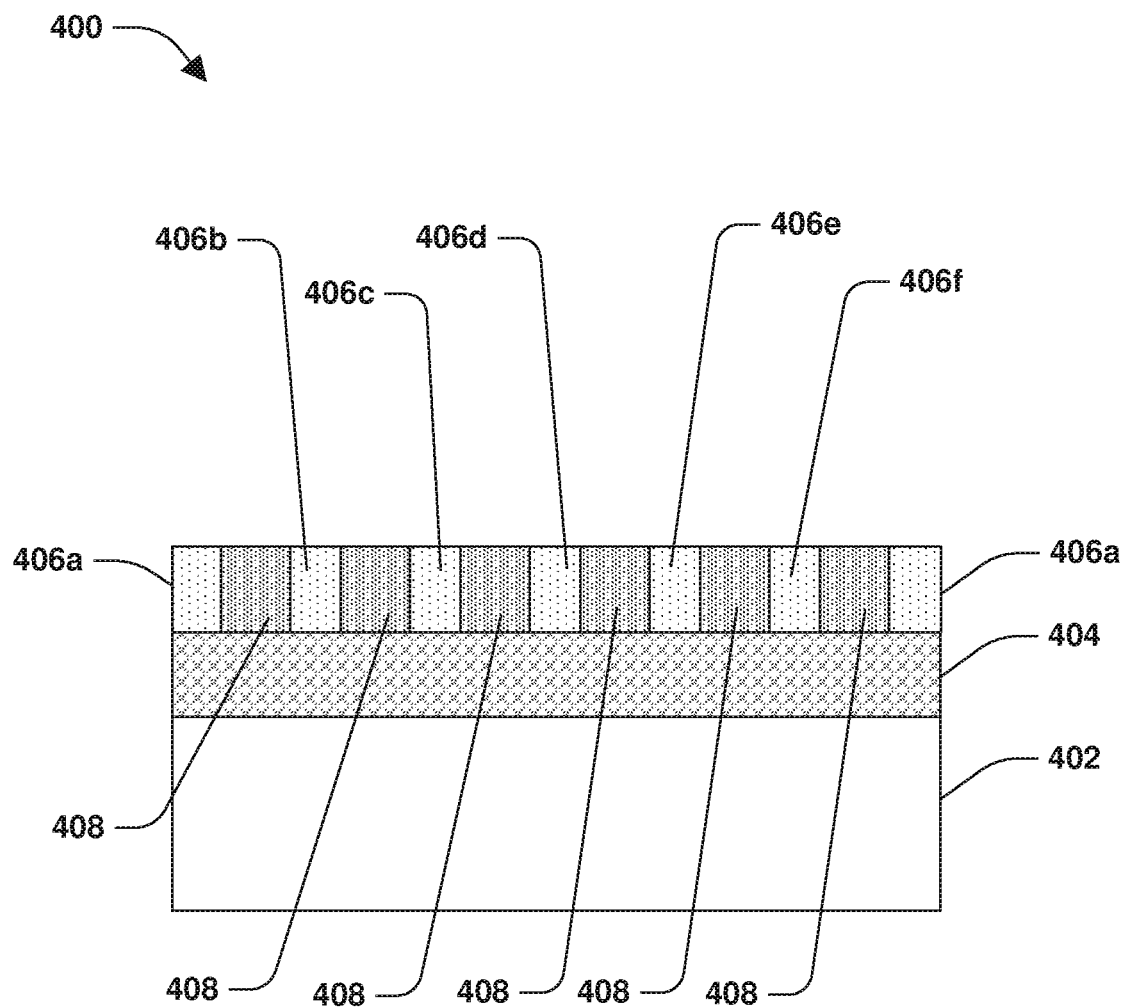
FIG. 4D is an illustration of a second porosification layer formed from a first portion of a first epitaxial layer, and a first support structure and a second support structure formed from one or more other portions of the first epitaxial layer.

At 106 of the method 100, a second porosification layer 408 is formed from a first portion of the first epitaxial layer 406, as illustrated by FIG. 4D. In one or more embodiments, the second porosification layer 408 is formed by applying a second porosification process to the first portion of the first epitaxial layer 406. In one or more embodiments, the second porosification process is performed with marginal exclusion. Portions of the first epitaxial layer 406 that are not porosified (non-porosified portions) remain as one or more support structures, such as the first support structure 406a and/or the second support structure. The non-porosified portions are formed by utilizing a hard mask or seal ring to block the second porosification process from porosifying the non-porosified portions. In one or more embodiments, the first support structure 406a is formed from a second portion of the first epitaxial layer 406 that is not porosified by the second porosification process, and thus the first support structure 406a comprises a non-porosified portion of the first epitaxial layer 406. The first support structure 406a is formed over the first porosification layer 404. In one or more embodiments, the first support structure 406a includes a loop-shaped structure (e.g., a ring structure), which will be further described and illustrated in conjunction with FIG. 4I.

In one or more embodiments, a second support structure is formed from one or more portions of the first epitaxial layer 406 that are not porosified by the second porosification process, and thus the second support structure comprises the one or more non-porosified portion of the first epitaxial layer 406. The second support structure is formed over the first porosification layer 404. In one or more embodiments, the second support structure comprises a grid-shaped structure comprising a plurality of structures (e.g., support regions), such as the first structure 406b, the second structure 406c, the third structure 406d, the fourth structure 406e, and the fifth structure 406f, which will be further described and illustrated in conjunction with FIG. 4I. In this way, the second support structure comprise a plurality structures that are spaced apart from the first support structure 406a (the loop-shaped structure) by the second porosification layer 408. It may be appreciated the second support structure may comprise any number, shape, size, and/or arrangement of structures. In one or more embodiments, both the first support structure 406a and the second support structure are formed, as illustrated by FIG. 4D. In one or more embodiments, merely second support structure, and not the first support structure 406a, may be formed.

Figure 4E:
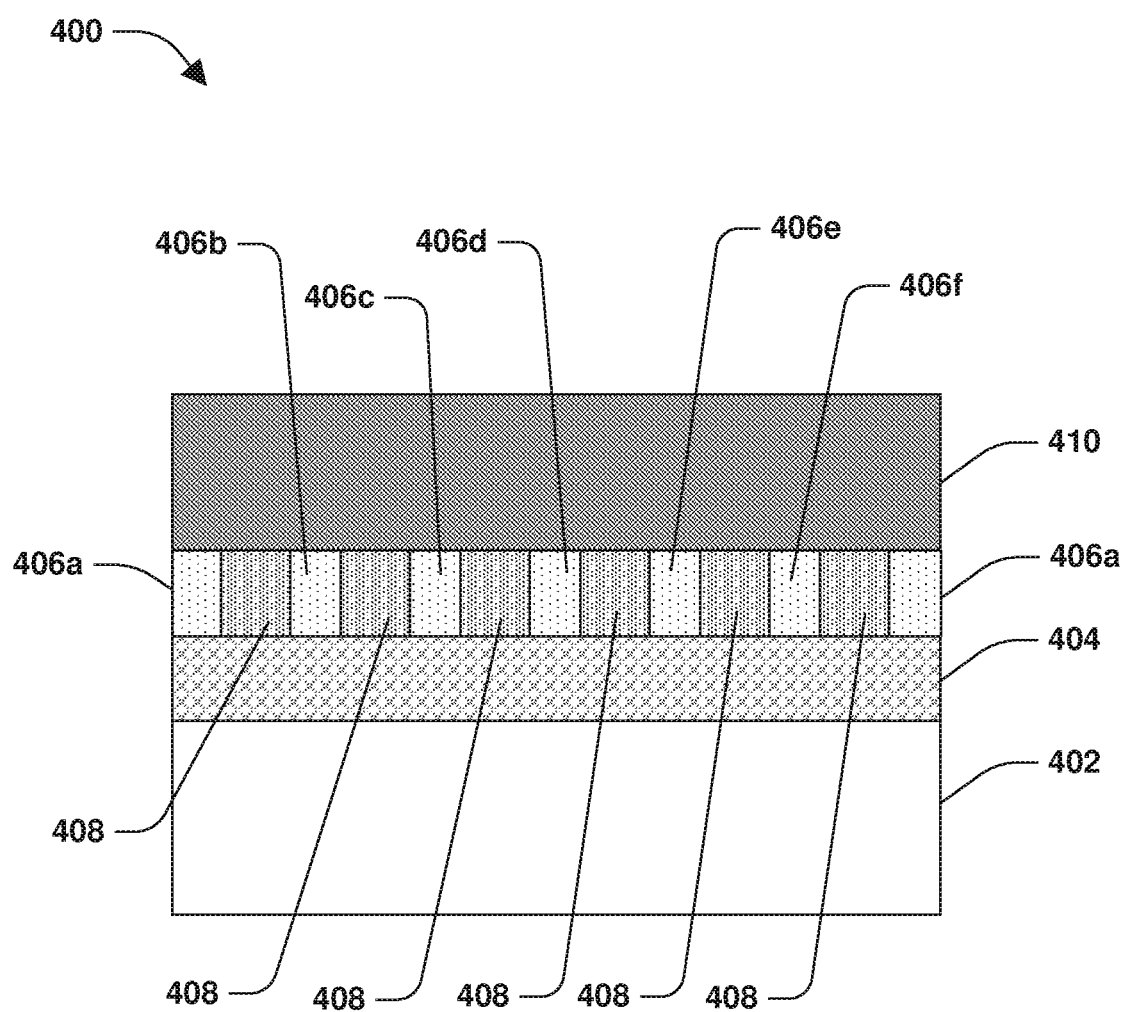
FIG. 4E is an illustration of a device layer formed over a support structure.

At 108 of the method 100, a second epitaxial layer 410 is formed over the second porosification layer 408, as illustrated by FIG. 4E. In one or more embodiments, the second epitaxial layer 410 is formed over the first support structure 406a and/or the second support structure. The second epitaxial layer 410 may be formed by a deposition process that deposits the second epitaxial layer 410 over the second porosification layer 408, the first support structure 406a, and/or the second support structure. In one or more embodiments, the second epitaxial layer 410 is a device layer comprising epitaxial material, which may be the same or different than epitaxial material of the first epitaxial layer 406 (e.g., epitaxial material of the first support structure 406a and/or the second support structure). In this way, the first support structure 406a and/or the second support structure consist essentially of the epitaxial material of the first epitaxial layer 406 and the device layer consists essentially of the epitaxial material of the second epitaxial layer 410.

Figure 4F:
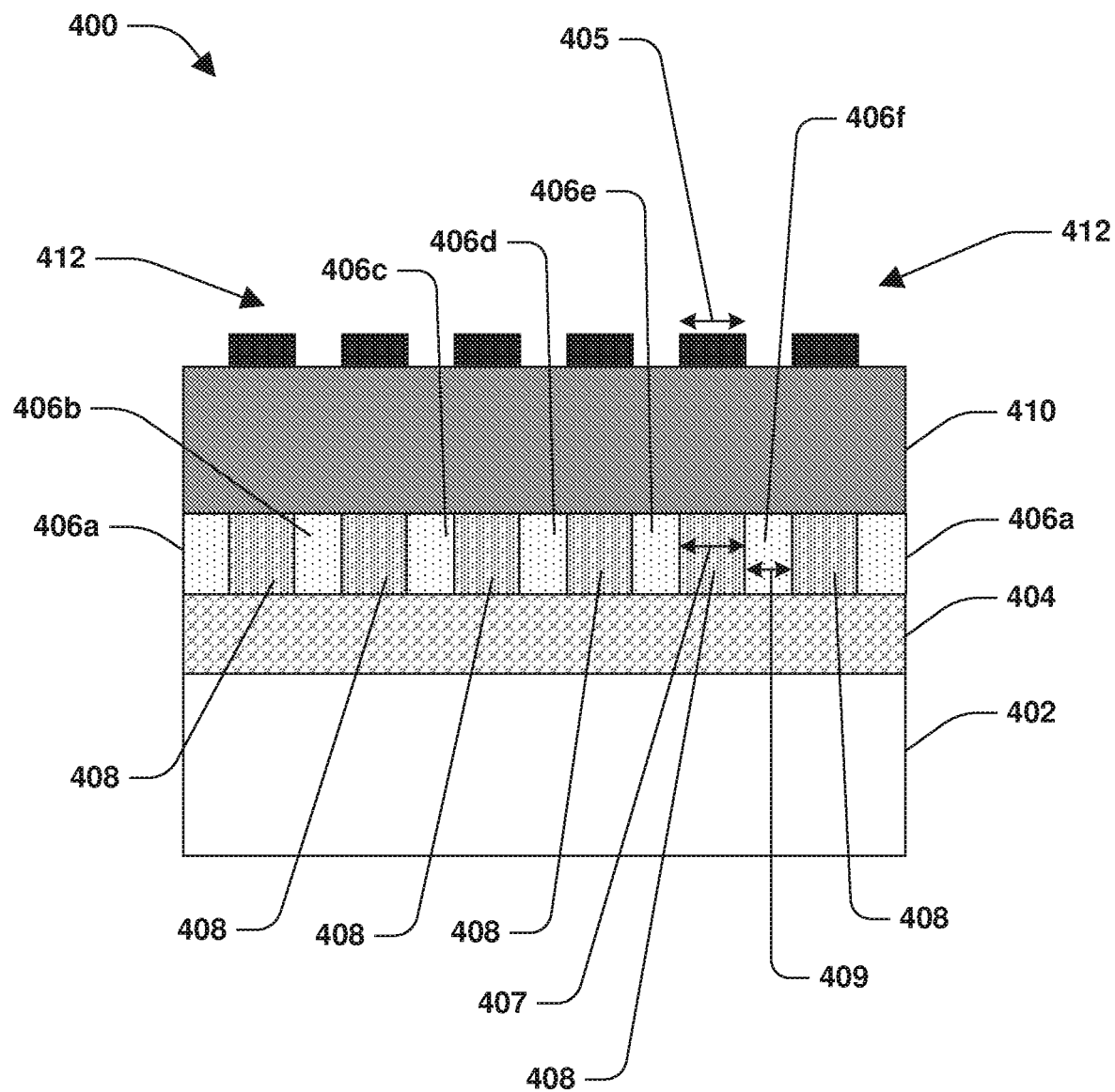
FIG. 4F is an illustration of one or more device structures formed over and/or within a device layer.

At 110 of the method 100, one or more device structures 412 are formed over and/or within the second epitaxial layer 410, such as over and/or within the device layer, as illustrated by FIG. 4F. In one or more embodiments, various device generation process steps may be performed on a front side of the semiconductor structure 400 to form the one or more device structures 412. In one or more embodiments, the one or more device structures 412 may be formed over the second porosification layer 408. In one or more embodiments, the one or more device structures 412 may be formed between the structures of the second support structure, such as between the first structure 406b the second structure 406c, between the second structure 406c and the third structure 406d, between the third structure 406d and the fourth structure 406e, and between the fourth structure 406e and the fifth structure 406f. In one or more embodiments, a width 405 of a device structure may be the same or similar as a width 407 of a porosification region of the second porosification layer 408 over which the device structure is formed, as illustrated by FIG. 4F. In one or more embodiments, the width 405 of the device structure may be smaller than the width 407 of the porosification region of the second porosification layer 408. In one or more embodiments, the width 405 of the device structure may be larger than the width 407 of the porosification region of the second porosification layer 408, and thus the device structure may be formed over at least a portion of one or more structures of the second support structure. In one or more embodiments, the width 405 of the device structure may be larger than a width 409 of a structure of the second support structure (e.g., the fifth structure 406f), as illustrated by FIG. 4F. In one or more embodiments, the width 405 of the device structure may be smaller than the width 409 of the structure of the second support structure. In one or more embodiments, the width 405 of the device structure may be the same or similar as the width 409 of the structure of the second support structure.

Figure 4G:
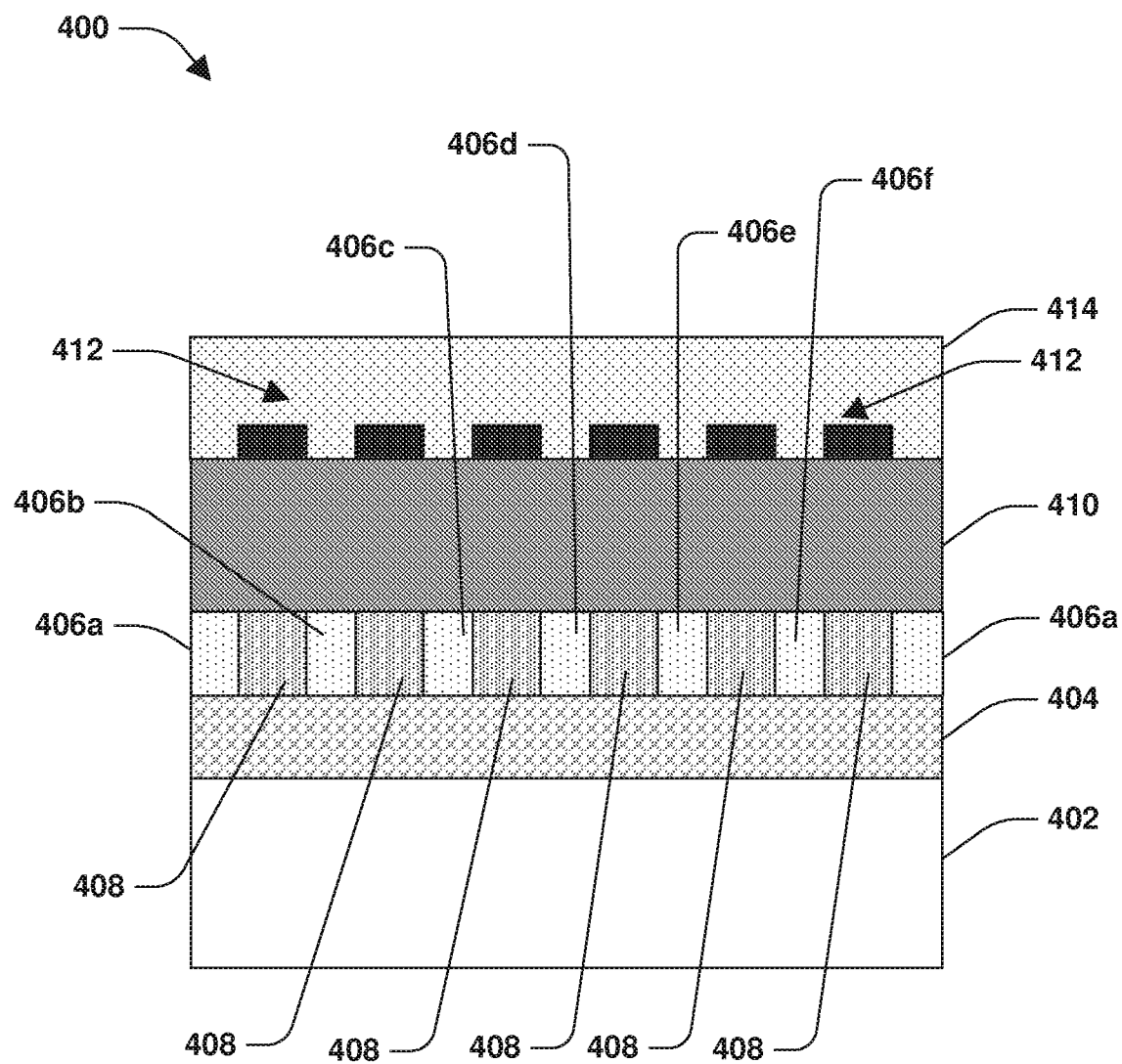
FIG. 4G is an illustration of a carrier attached to a semiconductor structure.

Once the one or more device structures 412 are formed, a carrier 414 is applied to the front side of the semiconductor structure 400, as illustrated by FIG. 4G. In one or more embodiments, the carrier 414 is a reverse carrier attachable to the front side of the semiconductor structure 400. The carrier 414 provides support for the front side of the semiconductor structure 400, such as while one or more subsequent processing steps are performed. In one or more embodiments, the semiconductor substrate 402 is removed/detached from the semiconductor structure 400, as illustrated by FIG. 4H.

Figure 4H:
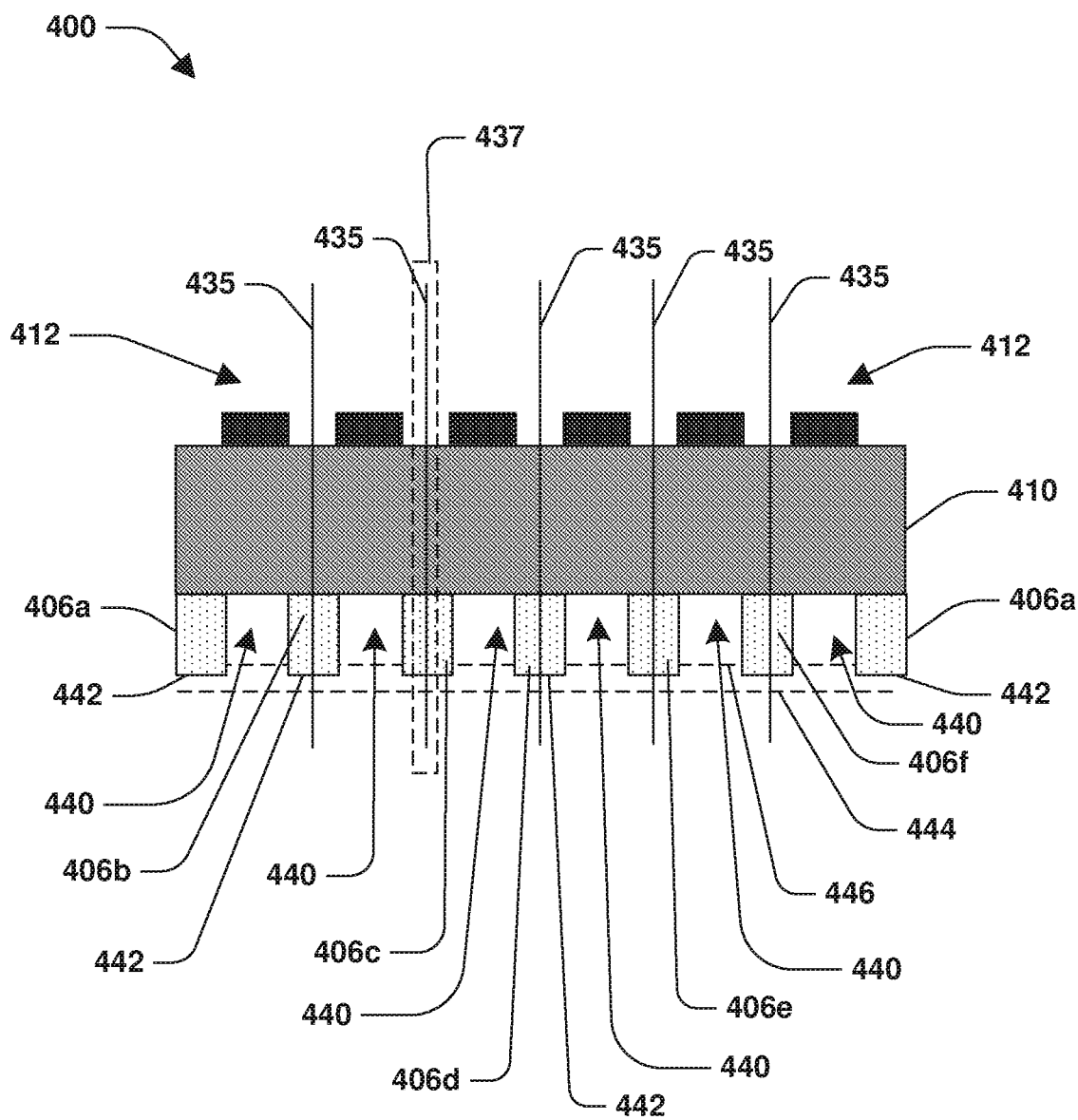
FIG. 4H is an illustration of a semiconductor structure with a support structure.

At 112 of the method 100, at least some of the first porosification layer 404 is removed from the semiconductor structure 400, as illustrated by FIG. 4H. In one or more embodiments, an upper portion of the first porosification layer 404 is separated from a lower portion of the first porosification layer 404. In one or more embodiments, at least some of the second porosification layer 408 is removed from the semiconductor structure 400. In one or more embodiments, a selective etching process can be utilized to selectively remove at least some of the first porosification layer 404 and/or at least some of the second porosification layer 408. In one or more embodiments, the selective etching process utilizes an etching material, such as hydrogen fluoride (HF), hydrogen peroxide (H2O2), or other etching material. Removing at least some of the first porosification layer 404 and/or at least some of the second porosification layer 408 exposes the first support structure 406a, such as a loop-shaped structure that loops along an edge of the semiconductor structure 400, and the second support structure, such as the first structure 406b, the second structure 406c, the third structure 406d, the fourth structure 406e, and the fifth structure 406f, to provide additional support and strength for the semiconductor structure 400.

While the carrier 414 is attached to the front side of the semiconductor structure 400, various backside processing steps may be performed, such as lithography, implantation, annealing, and/or other processing steps. In one or more embodiments, backside metallization can be performed upon a backside of the semiconductor structure 400. In one or more embodiments, the backside metallization may fill cavities 440 between the first support structure 406a, the first structure 406b, the second structure 406c, the third structure 406d, the fourth structure 406e, and/or the fifth structure 406f. The resulting metal layer may be a continuous metal layer where metal is filled within the cavities 440 and over top surfaces 442 of the first support structure 406a, the first structure 406b, the second structure 406c, the third structure 406d, the fourth structure 406e, and/or the fifth structure 406f (e.g., the metal is filled up to dashed line 444) or a non-continuous metal layer where metal is filled within the cavities 440 but below the top surfaces 442 of the first support structure 406a, the first structure 406b, the second structure 406c, the third structure 406d, the fourth structure 406e, and the fifth structure 406f (e.g., the metal is filled up to dashed line 446). Once the backside processing steps are complete, the carrier 414 may be removed from the semiconductor structure 400, as illustrated by FIG. 4H.

In one or more embodiments, a dicing process may be performed to separate the one or more device structures 412 by dicing 435 through regions between neighboring device structures, as illustrated by FIG. 4H. In one or more embodiments, the dicing 435 may involve the removal of material (e.g., a certain thickness of material may be removed) represented/illustrated by dashed line 437, as opposed to a cut along a line. In one or more embodiments, the dicing 435 may be performed through a single type of material, such as where the dicing 435 is through epitaxial material (e.g., semiconductor material) of the second epitaxial layer 410 and epitaxial material (e.g., semiconductor material) of the second support structure comprising epitaxial material from the first epitaxial layer 406. In this way, the dicing 435 may be performed through merely semiconductor material, in one or more embodiments. Because the dicing 435 may be performed through a single type of material, the dicing process and dicing tool may be selected based upon the type of material.

Figure 4I:
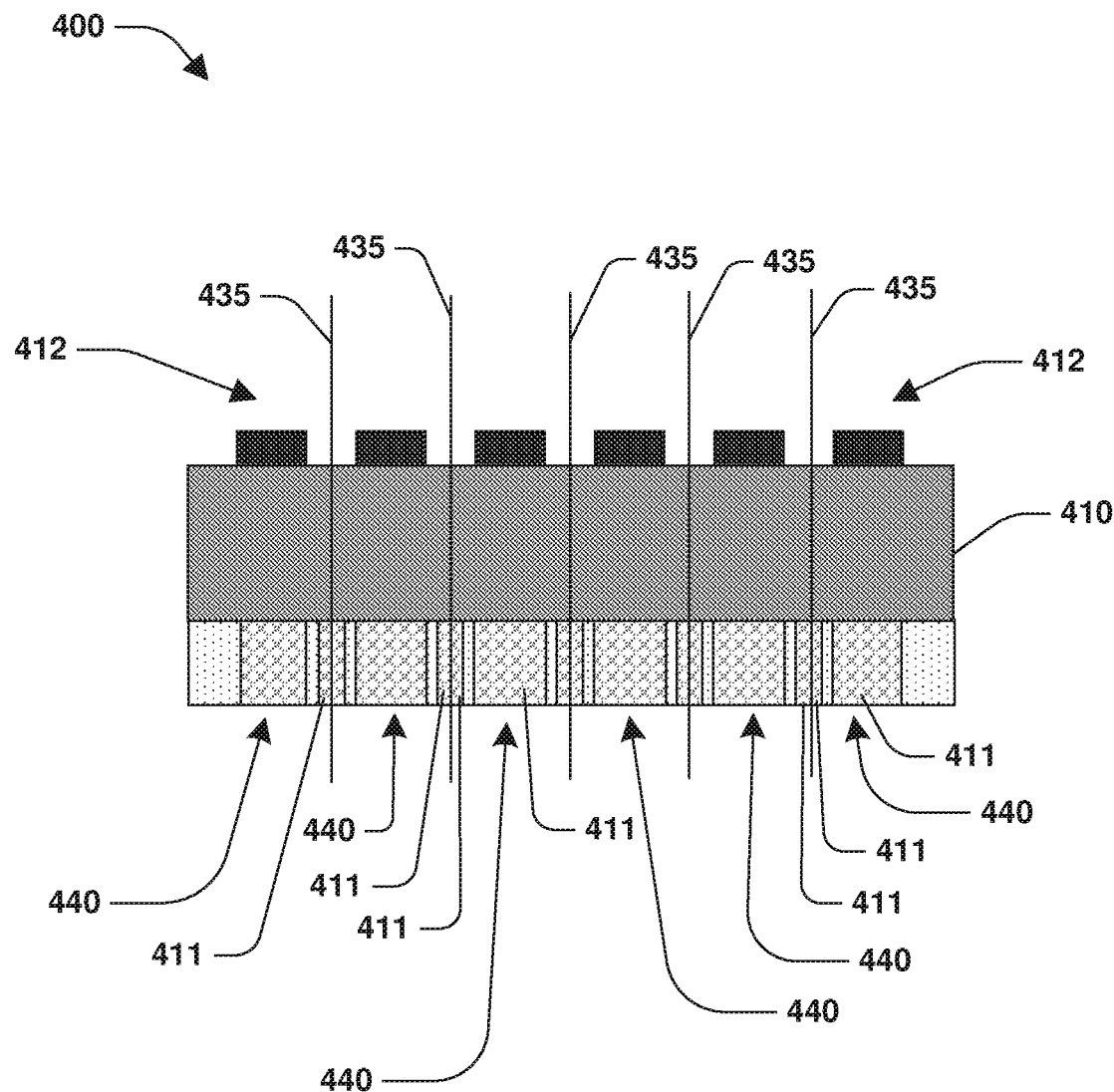
FIG. 4I is an illustration of a semiconductor structure with support structures and metal filled within cavities between the support structures.

It may be appreciated that FIG. 4H illustrates a first embodiment of one or more support structures formed for a semiconductor structure, and that FIG. 4I illustrates a second embodiment (e.g., separate from the first embodiment of FIG. 4H) of one or more support structures formed for a semiconductor structure. However, it may be appreciated that at least some of the processing steps described in relation to FIGS. 4A-4G may apply to both the first embodiment of FIG. 4H and/or the second embodiment of FIG. 4I.

In one or more embodiments where cavities between the first support structure 406a and structures of the second support structure (e.g., cavities 440) are optionally filled with metal 411, the dicing 435 may be performed through two materials, such as through epitaxial material (e.g., epitaxial material of the second epitaxial layer 410) and the metal 411, as illustrated by the second embodiment of FIG. 4I.

Figure 4J:
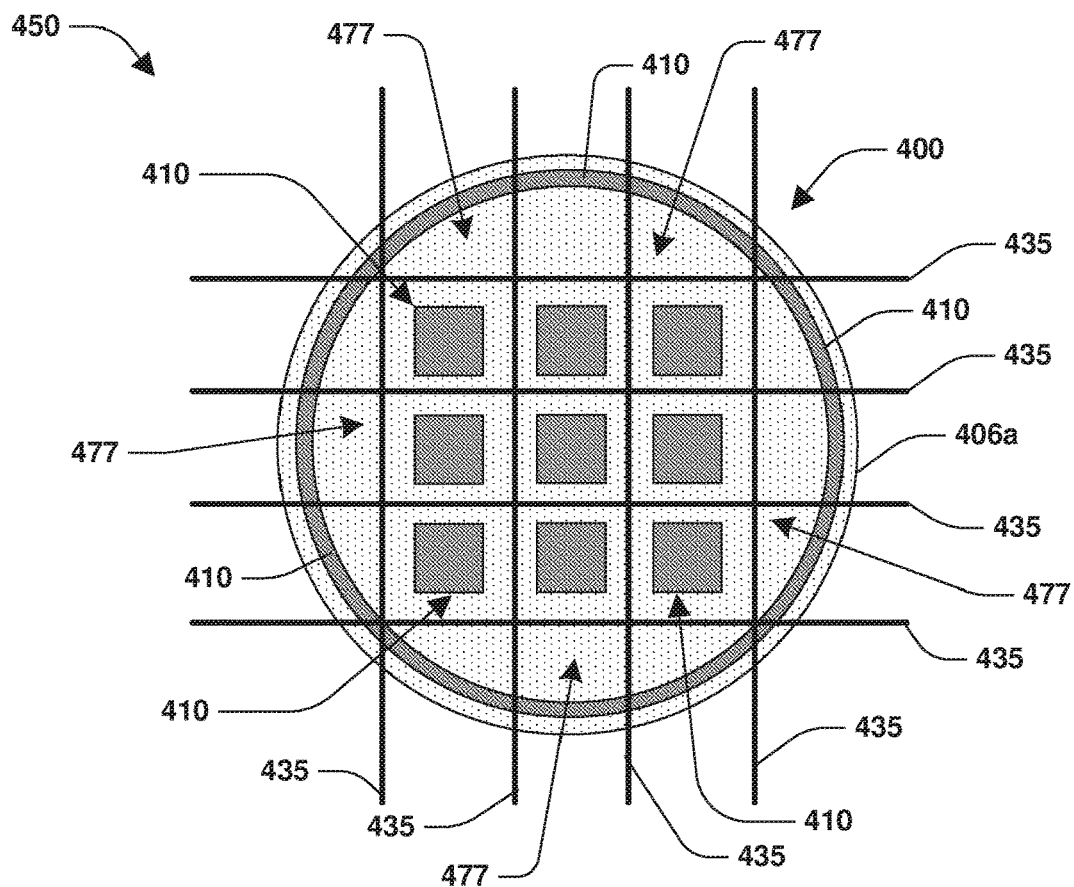
FIG. 4J is an illustration of an underneath view and a top down view of a semiconductor structure.
Figure 4J:
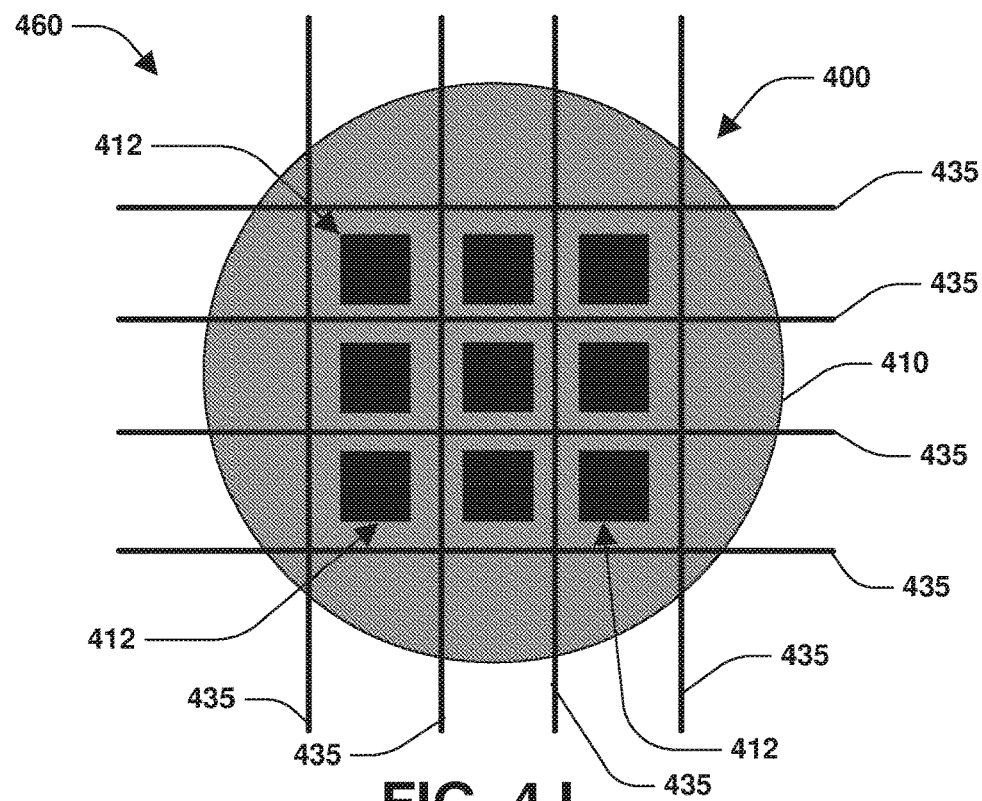

FIG. 4J illustrates an underneath view 450 of the semiconductor structure 400 with dicing 435 lines/regions. In one or more embodiments, the semiconductor structure 400 optionally includes the first support structure 406a that may loop around an edge of the semiconductor structure 400, such as around an edge of the second epitaxial layer 410 (device layer) and around a second support structure 477. In one or more embodiments, the semiconductor structure 400 includes the second support structure 477. In one or more embodiments, the second support structure 477 is spaced apart from the first support structure 406a by the second epitaxial layer 410 such that the first support structure 406a loops around the second support structure 477. FIG. 4J illustrates a top down view 460 of the semiconductor structure 400 with dicing 435 lines/regions. In one or more embodiments, the one or more device structures 412 are positioned over and/or within the second epitaxial layer 410 (device layer).

Figure 4K:
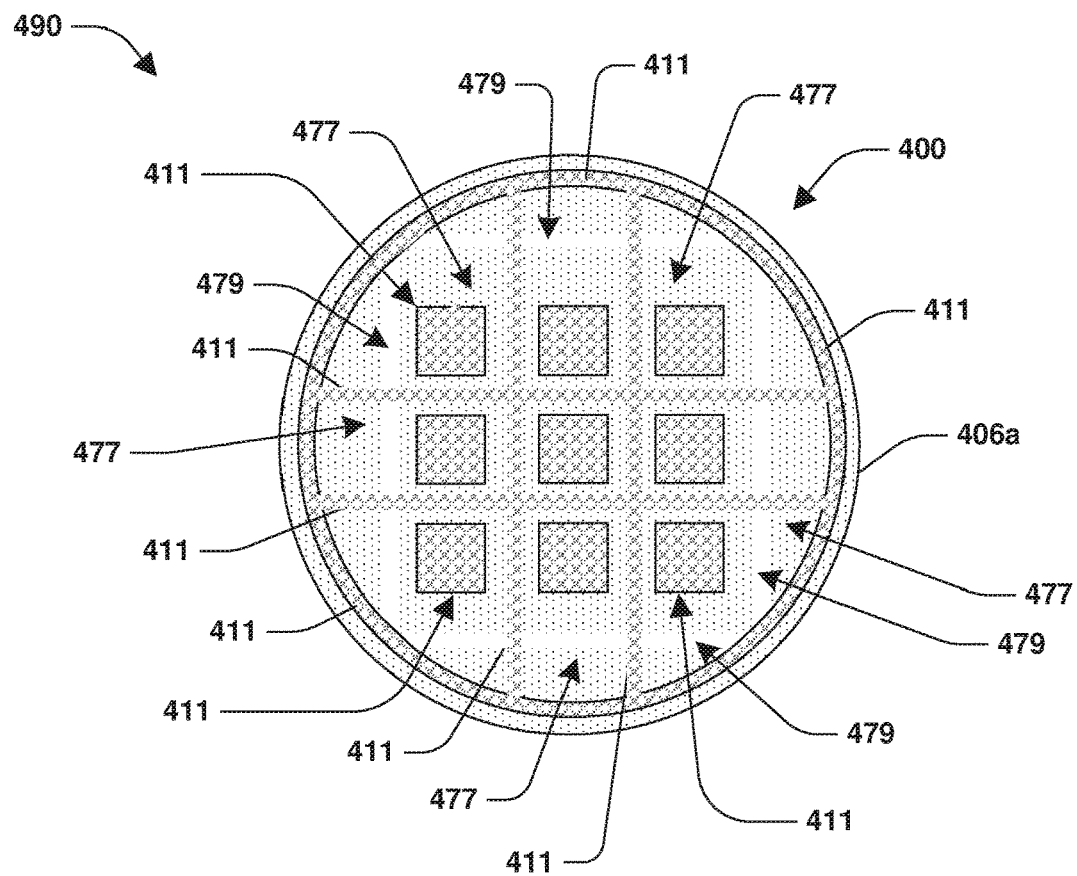
FIG. 4K is an illustration of an underneath view and a top down view of a semiconductor structure with support structures and metal filled within cavities between the support structures.
Figure 4K:
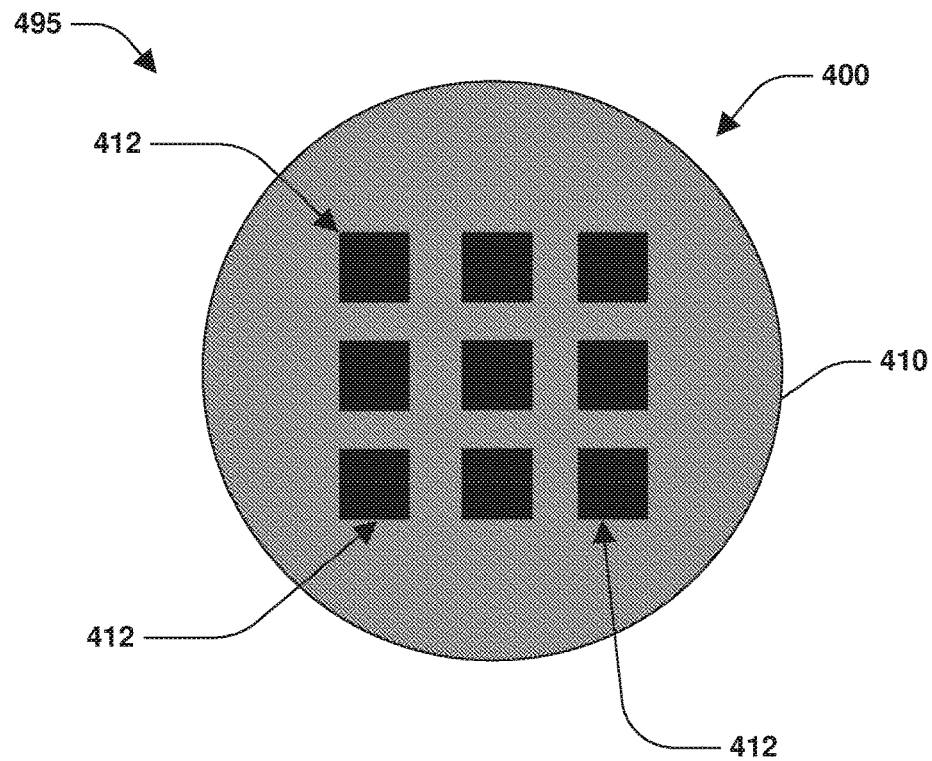

It may be appreciated that FIG. 4J illustrates underneath and top down views of a first embodiment of one or more support structures formed for a semiconductor structure, and that FIG. 4K illustrates underneath and top down views of a second embodiment (e.g., separate from the first embodiment of FIG. 4J) of one or more support structures formed for a semiconductor structure. However, it may be appreciated that at least some of the processing steps described in relation to FIGS. 4A-4G may apply to both the first embodiment of FIG. 4J and/or the second embodiment of FIG. 4K.

FIG. 4K illustrates an underneath view 490 of the semiconductor structure 400 where metal 411 has been filled within cavities between support structures. In one or more embodiments, the semiconductor structure 400 optionally includes a porosification region 479 (e.g., an optional opening) into which metal material may be optionally filled. FIG. 4K illustrates a top down view 495 of the semiconductor structure 400 where the metal 411 has been filled within the cavities between the support structures.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method, comprising:
   forming a first porosification layer over a semiconductor substrate;
   forming a first epitaxial layer over the first porosification layer;
   forming a second porosification layer from a first portion of the first epitaxial layer and a support structure from a second portion of the first epitaxial layer; and forming a second epitaxial layer over the second porosification layer.

2. The method of claim 1, wherein forming the first porosification layer includes applying a first porosification process to the semiconductor substrate and forming the second porosification layer includes applying a second porosification process to the first epitaxial layer.

3. The method of claim 1, wherein the support structure includes a plurality of portions.

4. The method of claim 1, wherein the support structure includes a loop-shaped structure.

5. The method of claim 1, wherein the support structure includes a grid-shaped structure.

6. The method of claim 1, wherein the support structure includes a loop-shaped structure disposed around a second structure spaced apart from the loop-shaped structure.

7. The method of claim 6, wherein the second structure is a grid-shaped structure.

8. The method of claim 1, further comprising:
forming one or more device structures within the second epitaxial layer.

9. The method of claim 1, further comprising:
forming one or more device structures over the second epitaxial layer.

10. The method of claim 1, further comprising:
separating an upper portion of the first porosification layer from a lower portion of the first porosification layer.

11. A method, comprising:
forming a first porosification layer over a semiconductor substrate;
forming a first epitaxial layer over the first porosification layer;
forming a second porosification layer from a first portion of the first epitaxial layer and a support structure from a second portion of the first epitaxial layer, wherein the support structure includes a loop-shaped structure disposed around a second structure spaced apart from the loop-shaped structure.

12. The method of claim 11, further comprising:
forming the support structure over the first porosification layer.

13. The method of claim 11, comprising applying a porosification process to the first epitaxial layer.

14. The method of claim 13, wherein the porosification process porosifies only a portion of the first epitaxial layer, the support structure including a non-porosified portion of the first epitaxial layer.

15. The method of claim 14, wherein the non-porosified portion includes a plurality of portions.

16. The method of claim 11, comprising forming a device layer that includes forming a second epitaxial layer.

17. A method, comprising:
forming a first porosification layer over a semiconductor substrate;
forming a first epitaxial layer over the first porosification layer;
forming a second porosification layer from a first portion of the first epitaxial layer and a support structure from a second portion of the first epitaxial layer; and
separating an upper portion of the first porosification layer from a lower portion of the first porosification layer.

18. The method of claim 17, wherein the support structure includes a loop-shaped structure.

19. The method of claim 17, wherein the support structure includes a grid-shaped structure.

* * * * *